US012482630B2

(12) United States Patent
Nomura

(10) Patent No.: US 12,482,630 B2
(45) Date of Patent: Nov. 25, 2025

(54) MULTIPLE CHARGED PARTICLE BEAM WRITING APPARATUS, MULTIPLE CHARGED PARTICLE BEAM WRITING METHOD, AND COMPUTER READABLE RECORDING MEDIA STORING PROGRAM

(71) Applicant: NuFlare Technology, Inc., Yokohama (JP)

(72) Inventor: Haruyuki Nomura, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 18/004,018

(22) PCT Filed: Apr. 26, 2022

(86) PCT No.: PCT/JP2022/018957

§ 371 (c)(1),
(2) Date: Dec. 30, 2022

(87) PCT Pub. No.: WO2023/209825

PCT Pub. Date: Nov. 2, 2023

(65) Prior Publication Data

US 2024/0242931 A1 Jul. 18, 2024

(51) Int. Cl.
*H01J 37/304* (2006.01)
*H01J 37/317* (2006.01)

(52) U.S. Cl.
CPC ........ *H01J 37/304* (2013.01); *H01J 37/3177* (2013.01); *H01J 2237/24507* (2013.01); *H01J 2237/24585* (2013.01)

(58) Field of Classification Search
None
See application file for complete search history.

(56) References Cited

U.S. PATENT DOCUMENTS 6,373,071 B1 4/2002 Innes et al.
6,420,717 B1 7/2002 Babin et al.
(Continued)

FOREIGN PATENT DOCUMENTS

CN 105027260 A 11/2015
CN 114388351 A 4/2022
(Continued)

OTHER PUBLICATIONS

Combined Taiwanese Office Action and Search Report issued Dec. 25, 2023, in corresponding Taiwanese Patent Application No. 111147806 (with English Translation), 6 pages.

(Continued)

*Primary Examiner* — James Choi
(74) *Attorney, Agent, or Firm* — Oblon, McClelland, Maier & Neustadt, L.L.P.

(57) ABSTRACT

The disclosure relates to a multiple charged particle beam writing apparatus that includes a dose representative value calculator that determines a representative dose for each mesh region irradiated by multiple beams. A calculation processor computes the temperature rise in a mesh region of interest due to beam irradiation, using a convolution of the dose values and a thermal spread function. An effective temperature calculator repeats this process while shifting the processing region along the stripe to obtain multiple temperature rises of the mesh area of interest and calculate a representative value of the multiple temperature rises as an effective temperature of the mesh area of interest. Based on the effective temperature, a dose corrector adjusts the beam doses to compensate for resist heating effects.

10 Claims, 20 Drawing Sheets

(56) References Cited

U.S. PATENT DOCUMENTS

| | | | |
|---|---|---|---|
| 6,720,565 B2 | 4/2004 | Innes et al. | |
| 8,563,953 B2 | 10/2013 | Nakayamada et al. | |
| 9,355,816 B2 | 5/2016 | Ookawa et al. | |
| 10,488,760 B2 | 11/2019 | Nomura | |
| 10,699,877 B2 | 6/2020 | Nomura et al. | |
| 11,556,061 B2 | 1/2023 | Kato et al. | |
| 12,249,483 B2 * | 3/2025 | Nomura | H01J 37/302 |
| 2014/0127628 A1 | 5/2014 | Fujimura et al. | |
| 2015/0028230 A1 | 1/2015 | Platzgummer | |
| 2017/0011884 A1 | 1/2017 | Nakamura et al. | |
| 2017/0069460 A1 | 3/2017 | Nakayamada et al. | |

FOREIGN PATENT DOCUMENTS

| | | | |
|---|---|---|---|
| JP | 2003-503837 A | | 1/2003 |
| JP | 2003-530711 A | | 10/2003 |
| JP | 2012-69675 A | | 4/2012 |
| JP | 2015-29096 A | | 2/2015 |
| JP | 2017-55109 A | | 3/2017 |
| JP | 2017-98285 A | | 6/2017 |
| JP | 2019-201111 A | | 11/2019 |
| JP | 2019201071 A | * | 11/2019 |
| KR | 2002-0036793 A | | 5/2002 |
| WO | WO 01/78104 A1 | | 10/2001 |

OTHER PUBLICATIONS

International Search Report issued Jun. 21, 2022, in PCT/JP2022/018957, filed on Apr. 26, 2022, (with English translation of Categories), 4 pages.

* cited by examiner

TEMPERATURE DISTRIBUTION IN ONE BEAM PITCH

TEMPERATURE RISES ARE SIGNIFICANT WHEN 500×500 = 250,000 BEAMS ARE SIMULTANEOUSLY EMITTED (3-1)

$$PSF(n,m;k-i,l-j) = \frac{A}{2}\,\mathrm{erf}\left(\frac{R_g}{\sigma_{n,m}}\right)\left[\mathrm{erf}\left\{\frac{(k-i-1/2)\cdot s}{\sigma_{n,m}}\right\} - \mathrm{erf}\left\{\frac{(k-i+1/2)\cdot s}{\sigma_{n,m}}\right\}\mathrm{erf}\left\{\frac{(l-j-1/2)\cdot s}{\sigma_{n,m}}\right\} - \mathrm{erf}\left\{\frac{(l-j+1/2)\cdot s}{\sigma_{n,m}}\right\}\right]$$

(3-2) $$A = \frac{V}{R_g \cdot \rho \cdot C_p}$$

(3-3) $$\sigma_{n,m} = \sqrt{4\lambda(n-m)\cdot t_{\mathrm{trk-cycle}}}$$

(3-4) $$t_{\mathrm{trk-cycle}} = \frac{W}{Nv_{stage}}$$

FIG.15

(2)

$$T(k,l) = \frac{1}{N} \sum_{m=k-N+1}^{k} \sum_{n=0}^{m} \sum_{j=0}^{N-1} \sum_{i=n}^{n+N-1} \frac{\boldsymbol{D_{ij}}}{\boldsymbol{N}} \cdot PSF(n,m;k-i,l-j)$$

(4)

$$T(k,l) = \frac{1}{N}\left\{ \sum_{n=0}^{k-N+1} \sum_{j=0}^{N-1} \sum_{i=n}^{n+N-1} \frac{\boldsymbol{D_{ij}}}{\boldsymbol{N}} \cdot \mathrm{PSF}(n,m;k-i,l-j) + \sum_{n=0}^{k-N+2} \sum_{j=0}^{N-1} \sum_{i=n}^{n+N-1} \frac{\boldsymbol{D_{ij}}}{\boldsymbol{N}} \cdot \mathrm{PSF}(n,m;k-i,l-j) + \cdot\cdot\cdot + \sum_{n=0}^{k} \sum_{j=0}^{N-1} \sum_{i=n}^{n+N-1} \frac{\boldsymbol{D_{ij}}}{\boldsymbol{N}} \cdot \mathrm{PSF}(n,m;k-i,l-j) \right\}$$

FIG.18

(3-1)

$$PSF(n,m;k-i,l-j) = \frac{A}{2}\operatorname{erf}\left(\frac{R_g}{\sigma_{n,m}}\right)\left[\operatorname{erf}\left\{\frac{(k-i-1/2)\cdot s}{\sigma_{n,m}}\right\} - \operatorname{erf}\left\{\frac{(k-i+1/2)\cdot s}{\sigma_{n,m}}\right\}\operatorname{erf}\left\{\frac{(l-j-1/2)\cdot s}{\sigma_{n,m}}\right\} - \operatorname{erf}\left\{\frac{(l-j+1/2)\cdot s}{\sigma_{n,m}}\right\}\right]$$

(3-2) $$A = \frac{V}{R_g \cdot \rho \cdot C_p},$$

(7-1) $$\sigma_{n,m} = \sqrt{4\lambda \sum_{p=1}^{m-n} t^{p}_{\text{trk-cycle}}}$$

(7-2) $$t^{p}_{\text{trk-cycle}} = s/\boldsymbol{v^{p}_{stage}}$$

FIG.22

MULTIPLE CHARGED PARTICLE BEAM WRITING APPARATUS, MULTIPLE CHARGED PARTICLE BEAM WRITING METHOD, AND COMPUTER READABLE RECORDING MEDIA STORING PROGRAM

TECHNICAL FIELD

The present invention relates to a multiple charged particle beam writing apparatus, a multiple charged particle beam writing method, and a computer readable recording media storing a program, and relates to, for example, a correction method for resist heating that occurs in multiple-beam writing.

BACKGROUND ART

Lithography technology, which has a decisive part in progress of semiconductor device miniaturization, is the only process of generating a pattern and is an extremely important process in the semiconductor manufacturing process. In recent years, as LSIs have become more highly integrated, the circuit line widths required for semiconductor devices have become finer year by year. Here, an electron-beam writing technique has essentially excellent resolution, and an electron beam is used to write (or draw) on a wafer or the like.

For example, there is a writing apparatus using multiple beams. As compared with the case of writing with one electron beam, it is possible to perform irradiation with a large number of beams at a time by using multiple beams and to significantly increase throughput. In such a multiple-beam writing apparatus, for example, multiple beams are formed by causing an electron beam emitted from an electron emission source to pass through a mask with multiple holes, and each of the multiple beams is blanking-controlled. Then, each beam that is not shielded is reduced by an optical system and deflected by a deflector, and a desired position on a target object is irradiated with the beam.

Here, in writing using an electron beam, there is a problem that when irradiation is performed for a short period of time with an electron beam of high irradiation energy density, the substrate temperature overheats and the resist sensitivity changes, resulting in deterioration of line width accuracy, which is a phenomenon called resist heating. For example, in single-beam writing, a method of determining the dose correction amount for the current shot by accumulating the influence of temperature rise for each past shot with one beam has been employed. However, since a plurality of beams is used in multiple-beam writing, the method of accumulating the influence of temperature rise for each past shot and for each beam requires an enormous amount of calculation. In addition, since a plurality of beams is simultaneously shot in multiple-beam writing, it is necessary to consider the influence of temperature rise from a plurality of other beams positioned over a wide region that is irradiated simultaneously.

CITATION LIST

Patent Literature

Patent Literature 1: JP-A-2003-503837

SUMMARY OF INVENTION

Technical Problem

One aspect of the present invention provides an apparatus and a method that are capable of correcting resist heating without accumulating the influence of temperature rise for each shot and each beam in multiple-beam writing.

Solution to Problem

According to one aspect of the present invention, a multiple charged particle beam writing being a writing apparatus configured to irradiate a writing region on a surface of a target object with multiple charged particle beams, the multiple charged particle beam writing apparatus includes: a divider unit configured to divide each stripe region of a plurality of stripe regions obtained by dividing the writing region by a size of a first direction of a beam array region of multiple charged particle beams on the surface of the target object in the first direction into a plurality of mesh regions in the first direction and in a second direction that is a movement direction of a stage along the each stripe region; a dose representative value calculator unit configured to calculate, for each divided mesh region, a representative value of a plurality of doses of a plurality of beams with which an inside of the mesh region is irradiated as a dose representative value; a calculation processing unit configured to perform a calculation process of a rising temperature given to a mesh region of interest being one of the plurality of mesh regions by heat due to beam irradiation to each of the plurality of mesh regions in a processing region corresponding to the beam array region, the calculation process being performed by a convolution process using the dose representative value for each of the plurality of mesh regions and a thermal spread function representing thermal spread generated by the plurality of mesh regions; an effective temperature calculator unit configured to perform a repetitive process of repeating the calculation process while shifting a position of the processing region in the second direction on the stripe region and to calculate, as an effective temperature of the mesh region of interest, a representative value of a plurality of the rising temperatures obtained by performing the repetitive process a plurality of times until the mesh region of interest reaches, from one end of the processing region in the second direction, the other end; a dose corrector unit configured to correct, using the effective temperature, doses of a plurality of beams with which each mesh region of interest is irradiated; and a writing mechanism configured to write a pattern on the target object using the multiple charged particle beams having respective corrected doses.

According to another aspect of the present invention, a multiple charged particle beam writing method includes: dividing each stripe region of a plurality of stripe regions obtained by dividing a writing region of a target object by a size of a first direction of a beam array region of multiple charged particle beams on a surface of the target object in the first direction into a plurality of mesh regions in the first direction and in a second direction that is a movement direction of a stage along the each stripe region; calculating, for each divided mesh region, a statistical value of a plurality of doses of a plurality of beams with which an inside of the mesh region is irradiated as a dose statistical value; performing a calculation process of a rising temperature given to a mesh region of interest being one of the plurality of mesh regions by heat due to beam irradiation to each of the plurality of mesh regions in a processing region corresponding to the beam array region, the calculation process including a calculation process being a convolution process using the dose statistical value for each of the plurality of mesh regions and a thermal spread function representing thermal spread generated by the plurality of mesh regions; performing a repetitive process of repeating the calculation process while shifting a position in the second direction on the stripe region and calculating, as an effective temperature of the mesh region of interest, a representative value of a plurality of the rising temperatures obtained by performing the repetitive process a plurality of times until the mesh region of interest reaches, from one end of the processing region in the second direction, the other end; correcting, using the effective temperature, doses of a plurality of beams with which each mesh region of interest is irradiated; and writing a pattern on the target object using the multiple charged particle beams having respective corrected doses.

According to yet another aspect of the present invention, a computer readable recording media storing a program to make a computer execute, the program includes: dividing each stripe region of a plurality of stripe regions obtained by dividing a writing region of a target object by a size of a first direction of a beam array region of multiple charged particle beams on a surface of the target object in the first direction into a plurality of mesh regions in the first direction and in a second direction that is a movement direction of a stage along the each stripe region; calculating, for each divided mesh region, a statistical value of a plurality of doses of a plurality of beams with which an inside of the mesh region is irradiated as a dose statistical value; performing a calculation process of a rising temperature given to a mesh region of interest being one of the plurality of mesh regions by heat due to beam irradiation to each of the plurality of mesh regions in a processing region corresponding to the beam array region, the calculation process including a calculation process being a convolution process using the dose statistical value for each of the plurality of mesh regions and a thermal spread function representing thermal spread generated by the plurality of mesh regions; performing a repetitive process of repeating the calculation process while shifting a position in the second direction on the stripe region and calculating, as an effective temperature of the mesh region of interest, a representative value of a plurality of the rising temperatures obtained by performing the repetitive process a plurality of times until the mesh region of interest reaches, from one end of the processing region in the second direction, the other end; and correcting, using the effective temperature, doses of a plurality of beams with which each mesh region of interest is irradiated.

Advantageous Effects of Invention

According to one aspect of the present invention, it is possible to correct resist heating without accumulating the influence of temperature rise for each shot and each beam in multiple-beam writing.

BRIEF DESCRIPTION OF DRAWINGS

FIG. 15 is a diagram for explaining an example of a calculation expression for a thermal spread function in the first embodiment.

FIG. 18 is a diagram for explaining another part of the calculation expression for the effective temperature in the first embodiment.

FIG. 22 is a diagram for explaining an example of a calculation expression for a thermal spread function in the second embodiment.

DESCRIPTION OF EMBODIMENTS

In the following embodiments, a configuration using an electron beam will be described as an example of a charged particle beam. However, a charged particle beam is not limited to an electron beam and may be a beam using charged particles such as an ion beam.

First Embodiment

Figure 1:
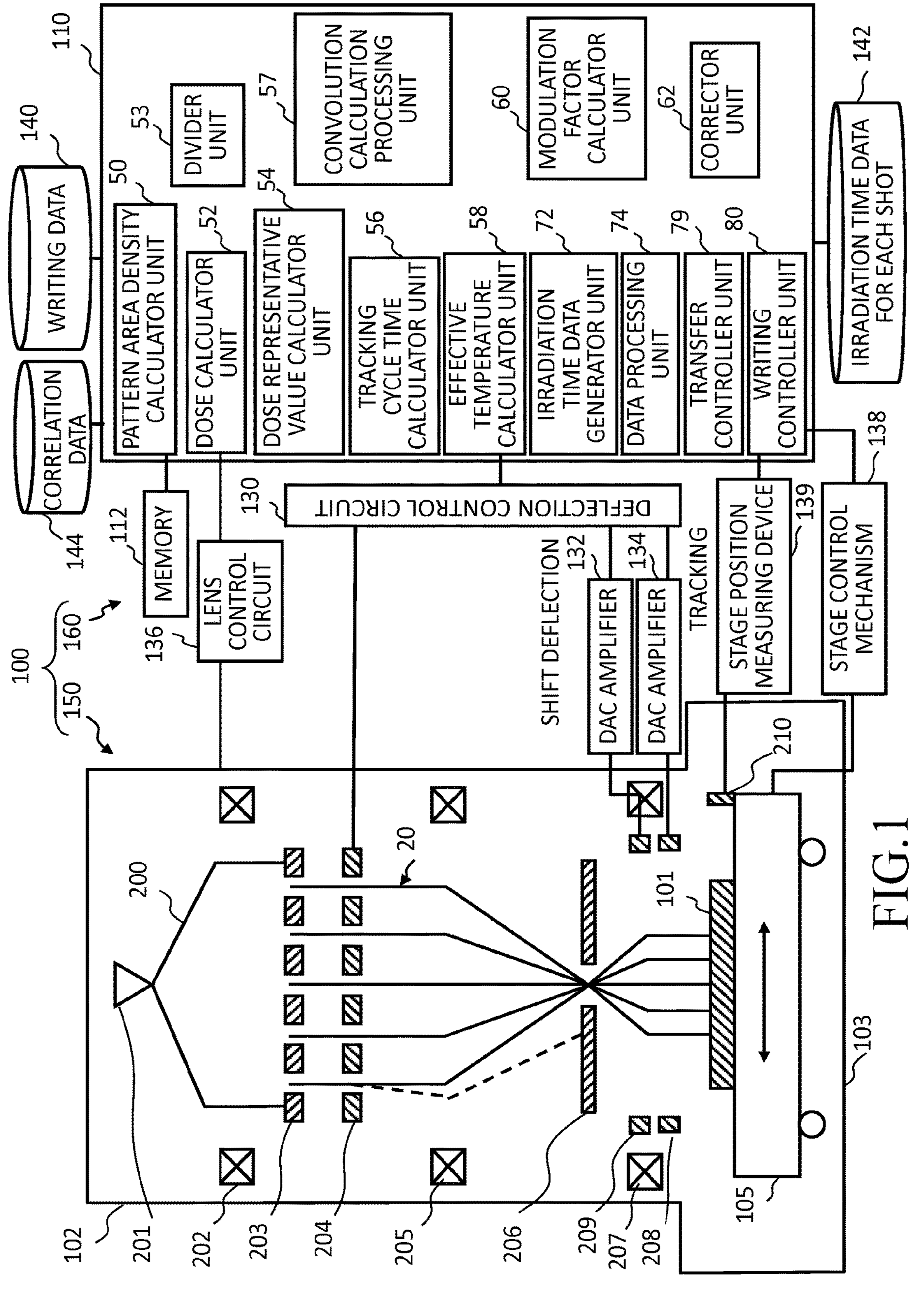
FIG. 1 is a conceptual diagram showing a configuration of a writing apparatus in a first embodiment.

FIG. 1 is a conceptual diagram showing a configuration of a writing apparatus according to a first embodiment. In FIG. 1, a writing apparatus 100 includes a writing mechanism 150 and a control system circuit 160. The writing apparatus 100 is an example of a multiple charged particle beam writing apparatus and an example of a multiple charged particle beam exposure apparatus. The writing mechanism 150 includes an electron optical column 102 (electron beam column) and a writing chamber 103. In the electron optical column 102, an electron emission source 201, an illumination lens 202, a shaping aperture array substrate 203, a blanking aperture array mechanism 204, a reduction lens 205, a limiting aperture substrate 206, an objective lens 207, a main-deflector 208, and a sub-deflector 209 are disposed. In the writing chamber 103, an XY stage 105 is disposed. On the XY stage 105, a target object 101 such as a mask to be a writing target substrate at the time of writing (at the time of exposure) is arranged. The target object 101 includes an exposure mask for manufacturing a semiconductor devices, a semiconductor substrate (silicon wafer) on which a semiconductor device is manufactured, or the like. The target object 101 is coated with resist. The target object 101 includes, for example, mask blanks that are coated with resist and on which nothing is written. On the XY stage 105, a mirror 210 for measuring the position of the XY stage 105 is further arranged.

The control system circuit 160 includes a control calculator 110, a memory 112, a deflection control circuit 130, digital/analog conversion (DAC) amplifier units 132 and 134, a lens control circuit 136, a stage control mechanism 138, a stage position measuring device 139, and storage devices 140, 142, and 144 such as magnetic disk drives. The control calculator 110, the memory 112, the deflection control circuit 130, the lens control circuit 136, the stage control mechanism 138, the stage position measuring device 139, and the storage devices 140, 142, and 144 are connected to each other via a bus (not shown). The deflection control circuit 130 is connected to the DAC amplifier units 132 and 134 and the blanking aperture array mechanism 204. The sub-deflector 209 is constituted by four or more electrodes, and is controlled by the deflection control circuit 130 via the DAC amplifier 132 for each electrode. The main-deflector 208 is constituted by four or more electrodes, and is controlled by the deflection control circuit 130 via the DAC amplifier 134 for each electrode. The stage position measuring device 139 receives reflected light from the mirror 210 to measure the position of the XY stage 105 using the principle of laser interferometry.

In the control calculator 110, a pattern area density calculator unit 50, a dose calculator unit 52, a divider unit 53, a dose representative value calculator unit 54, a tracking cycle time calculator unit 56, a convolution calculation processing unit 57, an effective temperature calculator unit 58, a modulation factor calculator unit 60, a corrector unit 62, a beam irradiation time data generator unit 72, a data processing unit 74, a transfer controller unit 79, and a writing controller unit 80 are disposed. Each unit of the pattern area density calculator unit 50, the dose calculator unit 52, the divider unit 53, the dose representative value calculator unit 54, the tracking cycle time calculator unit 56, the convolution calculation processing unit 57, the effective temperature calculator unit 58, the modulation factor calculator unit 60, the corrector unit 62, the beam irradiation time data generator unit 72, the data processing unit 74, the transfer controller unit 79, and the writing controller unit 80 includes a processing circuit. Such a processing circuit includes, for example, an electric circuit, a computer, a processor, a circuit board, a quantum circuit, or a semiconductor device. Each unit may use a common processing circuit (the same processing circuit) or may use different processing circuits (separate processing circuits). Information to be input to and output from the pattern area density calculator unit 50, the dose calculator unit 52, the divider unit 53, the dose representative value calculator unit 54, the tracking cycle time calculator unit 56, the convolution calculation processing unit 57, the effective temperature calculator unit 58, the modulation factor calculator unit 60, the corrector unit 62, the beam irradiation time data generator unit 72, the data processing unit 74, the transfer controller unit 79, and the writing controller unit 80, and information during calculation are stored in the memory 112 each time.

The writing operation of the writing apparatus 100 is controlled by the writing controller unit 80. In addition, a transfer process of beam irradiation time data for each shot to the deflection control circuit 130 is controlled by the transfer controller unit 79.

In addition, chip data is input from the outside of the writing apparatus 100 and stored in the storage device 140. Writing data includes chip data and writing condition data. In the chip data, a figure code, coordinates, a size, and the like are defined for each figure pattern, for example. The writing condition data includes information indicating multiplicity and a stage speed.

In addition, the storage device 144 stores correlation data, which will be described later, for calculating a modulation factor for correcting resist heating.

Here, FIG. 1 shows the components necessary for explaining the first embodiment. The writing apparatus 100 may include other normally necessary components.

Figure 2:
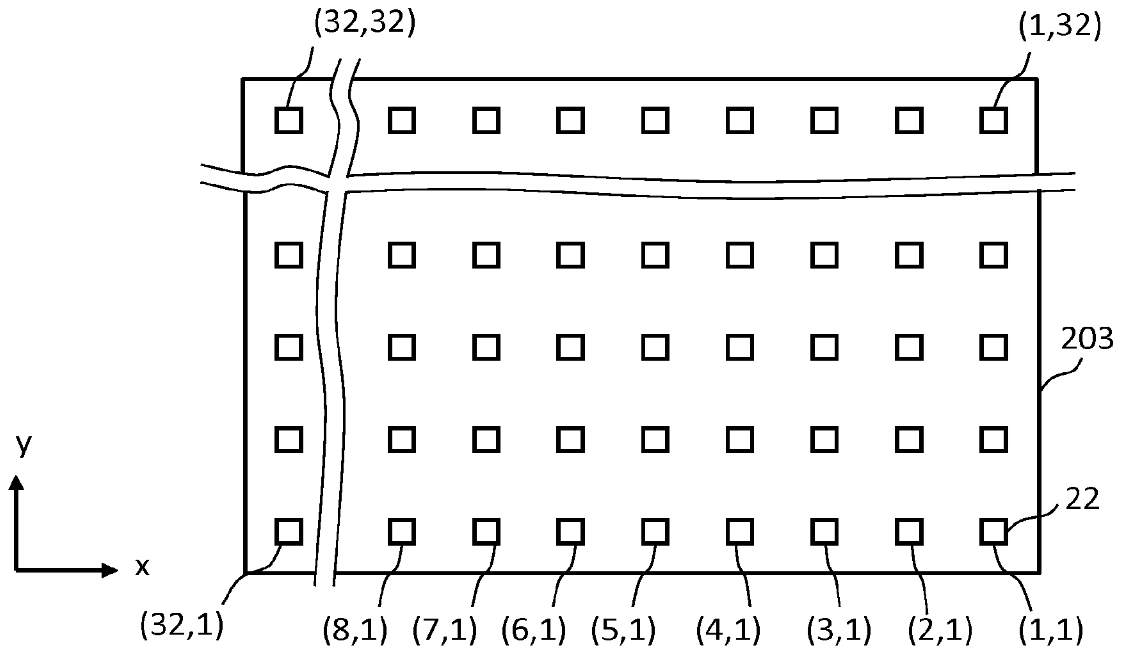
FIG. 2 is a conceptual diagram showing a configuration of a shaping aperture array substrate in the first embodiment.

FIG. 2 is a conceptual diagram showing a configuration of a shaping aperture array substrate in the first embodiment. In FIG. 2, the shaping aperture array substrate 203 is formed with holes (openings) 22 of p rows long (y direction)×q columns wide (x direction) (p, q≥2) at a predetermined arrangement pitch in a matrix. The example of FIG. 2 shows, for example, that holes 22 of 500 rows×500 columns are formed in the width and length directions (x and y directions). The number of the holes 22 is not limited thereto. The holes 22 are each formed in a rectangular shape with the same size and shape. Alternatively, the holes 22 may be circular with the same diameter. A part of an electron beam 200 passes through each of the holes 22, thereby forming multiple beams 20. In other words, the shaping aperture array substrate 203 forms the multiple beams 20.

Figure 3:
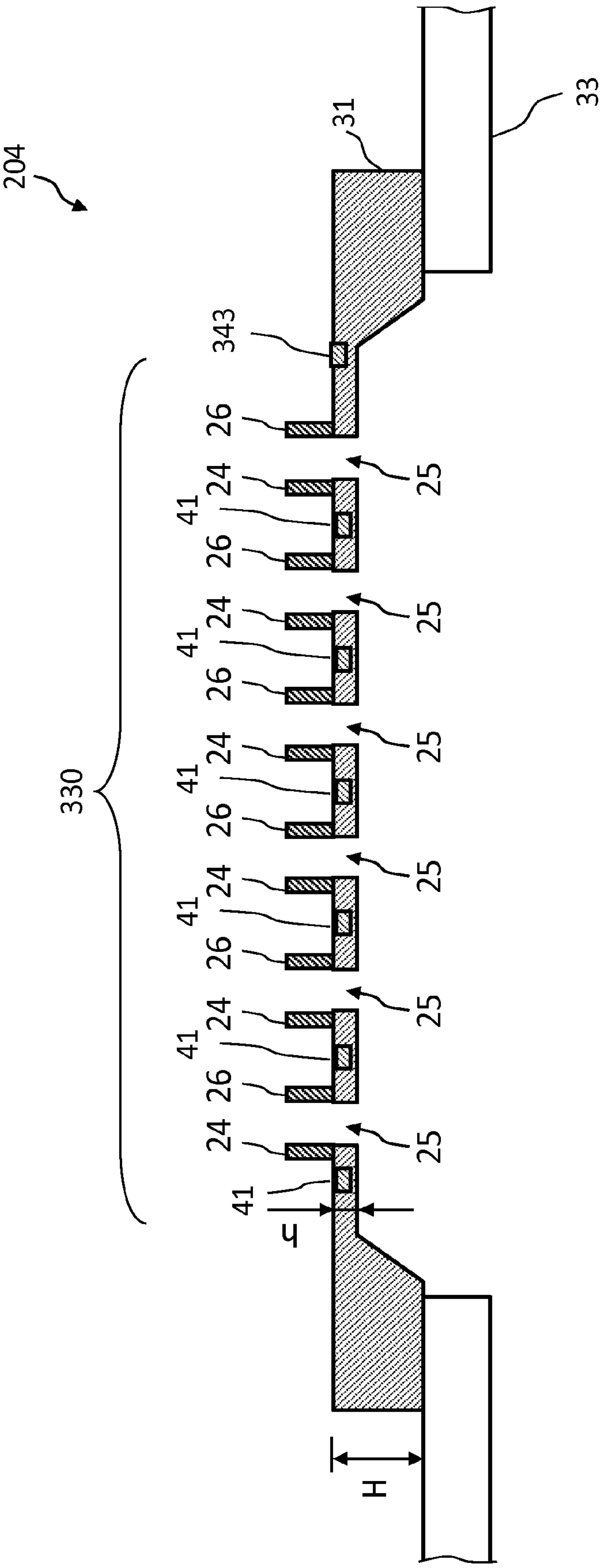
FIG. 3 is a cross-sectional view showing a configuration of a blanking aperture array mechanism in the first embodiment.

FIG. 3 is a cross-sectional view showing a configuration of a blanking aperture array mechanism in the first embodiment.

Figure 4:
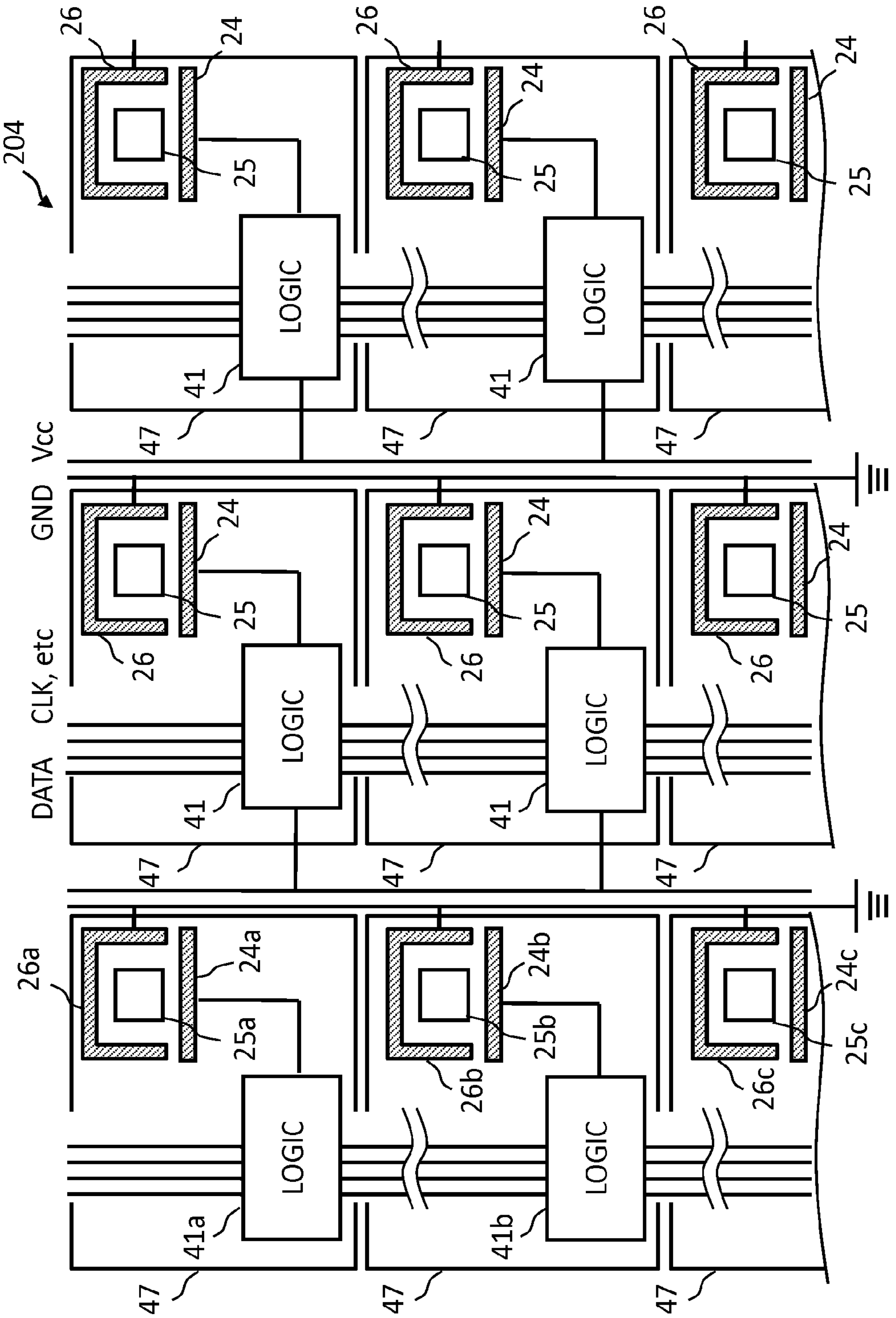
FIG. 4 is a conceptual top view showing a part of a configuration of the blanking aperture array mechanism in a membrane region in the first embodiment.

FIG. 4 is a conceptual top view showing a part of the configuration of the blanking aperture array mechanism in a membrane region in the first embodiment. In FIGS. 3 and 4, the positions of a control electrode 24, a counter electrode 26, a control circuit 41, and a pad 343 do not match. As shown in FIG. 3, in the blanking aperture array mechanism 204, a blanking aperture array substrate 31 using a semiconductor substrate made of silicon or the like is arranged on a support base 33. In a membrane region 330 in the central portion of the blanking aperture array substrate 31, a passage hole 25 (opening) is opened for the passage of each beam of the multiple beams 20 at a position corresponding to each hole 22 of the shaping aperture array substrate 203 shown in FIG. 2. For each passage hole 25 of the passage holes 25, a pair of the control electrode 24 and the counter electrode 26 (blankers: blanking deflectors) facing each other across the passage hole 25 is disposed. Inside the blanking aperture array substrate 31 in the vicinity of each passage hole 25, the control circuit 41 (logic circuit; a cell) that applies a deflection voltage to the control electrode 24 for each passage hole 25 is disposed. The counter electrode 26 for each beam is connected to the ground.

As shown in FIG. 4, each control circuit 41 is connected to n-bit (for example, 10-bit) parallel wiring for control signals. Each control circuit 41 is connected to n-bit parallel wiring for beam irradiation time control signals (data) as well as wiring for clock signals, load signals, shot signals, power supply, and the like. For the wiring and the like, some wiring of the parallel wiring may be used. For each beam constituting the multiple beams 20, an individual blanking mechanism 47 including the control electrode 24, the counter electrode 26, and the control circuit 41 is configured. In the first embodiment, a shift resister system is used as a data transfer system, for example. In the shift resister system, the multiple beams 20 are divided into a plurality of groups each including a plurality of beams, and a plurality of shift resisters for the plurality of beams in the same group is connected in series. Specifically, a plurality of the control circuits 41 formed in an array in the membrane region 330 is grouped at a predetermined pitch in the same row or the same column, for example. The control circuits 41 in the same group are connected in series as shown in FIG. 4. Then, signals from the pad 343 disposed for each group are transmitted to the control circuit 41 in the group.

Figure 5:
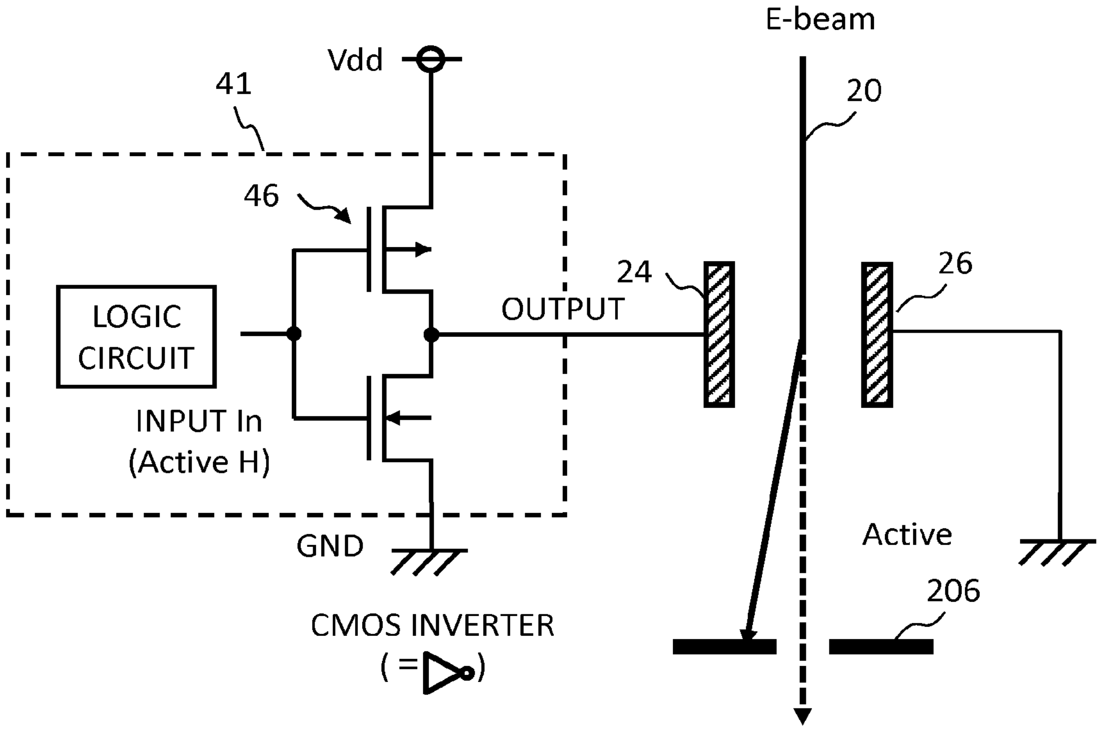
FIG. 5 is a diagram showing an example of an individual blanking mechanism in the first embodiment.

FIG. 5 is a diagram showing an example of an individual blanking mechanism in the first embodiment. In FIG. 5, an amplifier 46 (an example of a switching circuit) is disposed in the control circuit 41. In the example of FIG. 5, a complementary MOS (CMOS) inverter circuit serving as a switching circuit is disposed as an example of the amplifier 46. Either low (L) potential (for example, ground potential) lower than a threshold voltage or high (H) potential (for example, 1.5 V) equal to or higher than the threshold voltage is applied as a control signal to the input (IN) of the CMOS inverter circuit. In the first embodiment, in a state in which L potential is applied to the input (IN) of the CMOS inverter circuit, the output (OUT) of the CMOS inverter circuit applied to the control circuit 41 is positive potential (Vdd), and the corresponding beam 20 is deflected by an electric field due to a potential difference from the ground potential of the counter electrode 26, and controlled to be beam OFF by shielding with the limiting aperture substrate 206. On the other hand, in a state (active state) in which H potential is applied to the input (IN) of the CMOS inverter circuit, the output (OUT) of the CMOS inverter circuit is the ground potential, and the corresponding beam 20 is not deflected since the potential difference from the ground potential of the counter electrode 26 disappears, and controlled to be beam ON by passing through the limiting aperture substrate 206. Blanking is controlled by such deflection.

Then, each individual blanking mechanism 47 individually controls the beam irradiation time of the shot for each beam using a counter circuit (not shown) in accordance with a beam irradiation time control signal transferred for each beam.

Next, a specific example of an operation of the writing mechanism 150 is described. The electron beam 200 emitted from the electron emission source 201 (emission source) illuminates the entire shaping aperture array substrate 203 almost vertically by the illumination lens 202. The shaping aperture array substrate 203 is formed with the rectangular holes 22 (openings), and the electron beam 200 illuminates a region including all of the holes 22. Each of a part of the electron beam 200 with which the positions of the holes 22 are irradiated passes through each of the holes 22 of the shaping aperture array substrate 203, thereby forming the rectangular multiple beams (a plurality of electron beams) 20, for example. These multiple beams 20 pass through the respective corresponding blankers of the blanking aperture array mechanism 204 (first deflector: individual blanking mechanism 47). Each of these blankers individually blanking-controls the passing beams in such a manner that the beams are ON for a set writing time (beam irradiation time).

The multiple beams 20 having passed through the blanking aperture array mechanism 204 are reduced by the reduction lens 205 and travel toward the center hole formed in the limiting aperture substrate 206. Here, the electron beam deflected by the blankers of the blanking aperture array mechanism 204 deviates from the position of the hole in the center of the limiting aperture substrate 206 and is shielded by the limiting aperture substrate 206. On the other hand, the electron beam that is not deflected by the blankers of the blanking aperture array mechanism 204 passes through the hole in the center of the limiting aperture substrate 206 as shown in FIG. 1. In this manner, the limiting aperture substrate 206 shields each beam deflected by the individual blanking mechanism 47 in such a manner as to be beam OFF. Then, each beam of one shot is formed by the beam having been formed from the time the beam is ON until the beam is OFF, and passed through the limiting aperture substrate 206. The multiple beams 20 having passed through the limiting aperture substrate 206 are focused by the objective lens 207 to become a pattern image with a desired reduction ratio, and the entire multiple beams 20 having passed through the limiting aperture substrate 206 are collectively deflected in the same direction by the main-deflector 208 and the sub-deflector 209, and the respective irradiation positions of the beams on the target object 101 are irradiated with the beams. In addition, for example, when the XY stage 105 is continuously moved, tracking control is performed by deflecting the multiple beams 20 by the main-deflector 208 in such a manner that the beam irradiation position follows the movement of the XY stage 105. The multiple beams 20 emitted at a time are ideally to be aligned at a pitch equal to the array pitch of the holes 22 of the shaping aperture array substrate 203 multiplied by the above desired reduction ratio.

Figure 6:
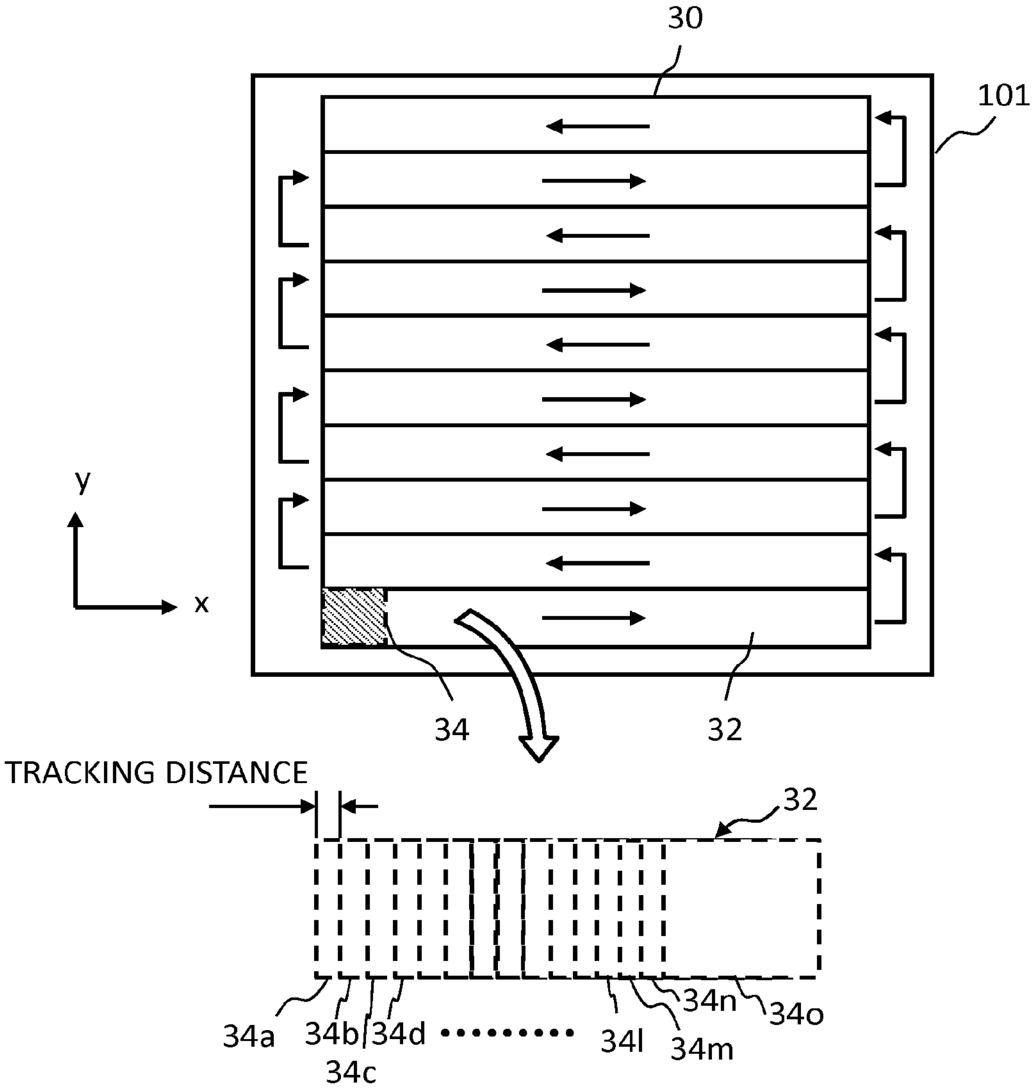
FIG. 6 is a conceptual diagram for explaining an example of a writing operation in the first embodiment.

FIG. 6 is a conceptual diagram for explaining an example of a writing operation in the first embodiment. As shown in FIG. 6, the writing region 30 of the target object 101 is virtually divided into a plurality of stripe regions 32 each having a strip shape with a predetermined width in the y direction, for example. First, the XY stage 105 is moved and adjusted in such a manner that the irradiation region 34 that can be irradiated with one shot of the multiple beams 20 is positioned at the left end of the first stripe region 32 or on the further left side, and writing is started. When writing is performed in the first stripe region 32, the XY stage 105 is moved in, for example, the −x direction in such a manner that the writing relatively proceeds in the x direction. The XY stage 105 is continuously moved at a constant speed, for example.

After the writing in the first stripe region 32 is completed, the stage position is moved in the −y direction, and the XY stage 105 is moved in, for example, the x direction in such a manner that the writing proceeds similarly in the −x direction. This operation is repeated to sequentially perform the writing in each stripe region 32. The writing time can be shortened by alternately changing the directions. However, writing is not limited to this writing performed by alternately changing the directions, and writing in each stripe region 32 may be performed in the same direction. When the XY stage 105 is moved at a constant speed, the continuous moving speed may be different for each stripe. In one shot, the multiple beams formed by passing through the holes 22 of the shaping aperture array substrate 203 form a plurality of shot patterns up to the same number as that of the holes 22 at a time.

Figure 7:
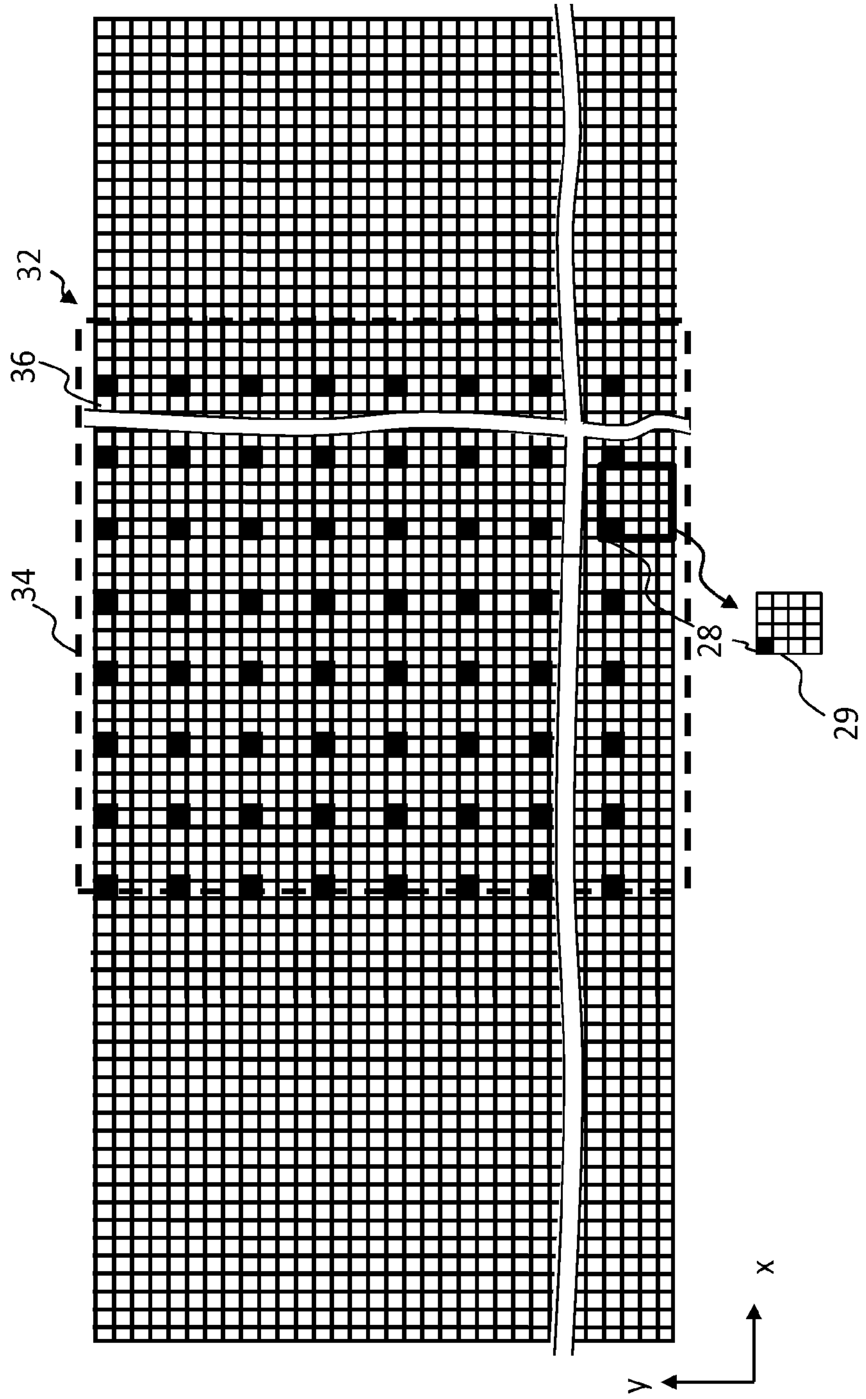
FIG. 7 is a diagram showing an example of a multiple-beam irradiation region and a writing target pixel in the first embodiment.

FIG. 7 is a diagram showing an example of a multiple-beam irradiation region and a writing target pixel in the first embodiment. In FIG. 7, the stripe region 32 is divided into a plurality of mesh regions in a mesh shape by the beam size of the multiple beams 20, for example. Each of these mesh regions is a pixel 36 that is a writing target (unit irradiation region, irradiation position, or writing position). The size of the pixel 36 that is the writing target is not limited to the beam size, and may be configured with any size regardless of the beam size. For example, the pixel 36 may be configured with a size of 1/a (a is an integer greater than or equal to 1) of the beam size. The example of FIG. 7 shows a case where the writing region 30 of the target object 101 is divided, for example, in the y direction into a plurality of stripe regions 32 by substantially the same width size as the size of the irradiation region 34 (beam array region) that can be irradiated with the multiple beams 20 at a time. The size of the rectangular irradiation region 34 in the x direction can be defined by the number of beams in the x direction×inter-beam pitch in the x direction. The size of the rectangular irradiation region 34 in the y direction can be defined by the number of beams in the y direction×inter-beam pitch in the y direction. The example of FIG. 7 shows, for example, that the multiple beams of 500 columns×500 rows are omitted to the multiple beams of 8 columns×8 rows. In the irradiation region 34, a plurality of pixels 28 (beam writing positions) that can be irradiated with one shot of the multiple beams 20 is shown. The pitch between the adjacent pixels 28 on the target object surface is the inter-beam pitch of the multiple beams 20. A rectangular region surrounded by the size of the beam pitch in the x and y directions constitutes one sub-irradiation region 29 (pitch cell). Each sub-irradiation region 29 includes one pixel 28. In the example of FIG. 7, a pixel at an upper left corner of each sub-irradiation region 29 is shown as the pixel 28 that is a beam writing position, for example. Each sub-irradiation region 29 is constituted by, for example, 10×10 pixels. The example of FIG. 7 shows, for example, that each sub-irradiation region 29 of 10×10 pixels is omitted to 4×4 pixels.

Figure 8:
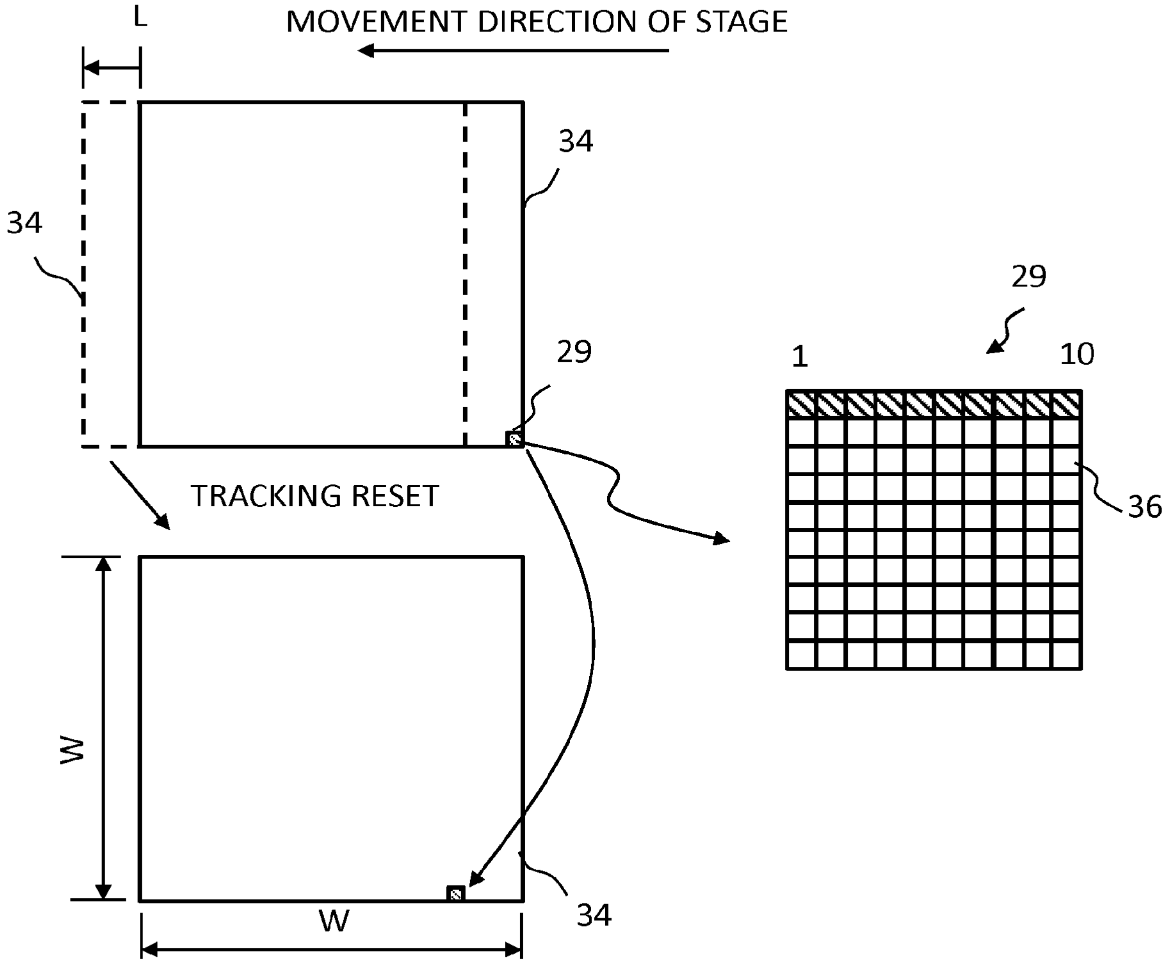
FIG. 8 is a diagram for explaining an example of a multiple-beam writing operation in the first embodiment.

FIG. 8 is a diagram for explaining an example of a multiple-beam writing operation in the first embodiment. The example of FIG. 8 shows a case where 10 different beams are used to perform writing in each sub-irradiation region 29 on the surface of the target object 101. The example of FIG. 8 further shows a writing operation in which the XY stage 105 moves continuously at a speed of moving by a distance L equal to, for example, 25-beam pitches while writing is performed in 1/10 (one of the number of beams used for irradiation) of the region of the sub-irradiation region 29. The writing operation shown in the example of FIG. 8 shows, for example, a case where writing (exposure) is performed in different 10 pixels in the same sub-irradiation region 29 by performing 10 shots of the multiple beams 20 at a shot cycle time $t_{trk\text{-}cycle}$ While sequentially shifting the irradiation positions (pixels 36) by the sub-deflector 209 while the XY stage 105 moves by the distance L equal to the 25-beam pitches. During the writing (exposure) in the 10 pixels, the irradiation region 34 is caused to follow the movement of the XY stage 105 by collectively deflecting the entire multiple beams 20 by the main-deflector 208 in such a manner that the irradiation region 34 does not shift its relative position with the target object 101 by the movement of the XY stage 105. In other words, tracking control is performed. Accordingly, the distance L over which the main-deflector 208 performs collective deflection during one tracking control is the tracking distance.

When one tracking cycle ends, tracking is reset, and the tracking returns to the previous tracking start position. Since the writing in the first pixel row from the top of each sub-irradiation region 29 has been completed, in the next tracking cycle after the tracking is reset, the sub-deflector 209 first performs deflection in such a manner as to align (shift) the beam writing position in order to perform writing in the pixel column in the second row from the top where writing is not performed in the sub-irradiation region 29. In this manner, every time the tracking is reset, the pixel column in which writing is performed next is changed. During 10 times of tracking control, writing is performed once in each pixel 36 in each sub-irradiation region 29. By repeating this operation during the writing in the stripe region 32, the position of the irradiation region 34 is sequentially moved from the irradiation regions 34*a* to 340 as shown in FIG. 6, and the writing in the stripe region 32 is performed.

In the example of FIG. 8, the sub-irradiation region 29, on the target object surface, positioned at the lower right corner of the irradiation region 34 with the width W is at a position moved by the distance L in the left direction from the lower right corner of the irradiation region 34 in the second tracking control. Accordingly, in the second tracking control, writing in the sub-irradiation region 29 that has been positioned at the lower right corner of the irradiation region 34 in the first tracking control is performed using another beam at a position away by the distance L from the lower right corner of the irradiation region 34 in the left direction. Here, the writing is performed using a beam that is 25 beams away in the −x direction from the beam at the lower right corner, for example.

For example, in a writing process in which the multiplicity is set to 2 per stage path, writing can be performed twice in each pixel 36 in each sub-irradiation region 29 with 20 times of tracking control.

Figure 9:
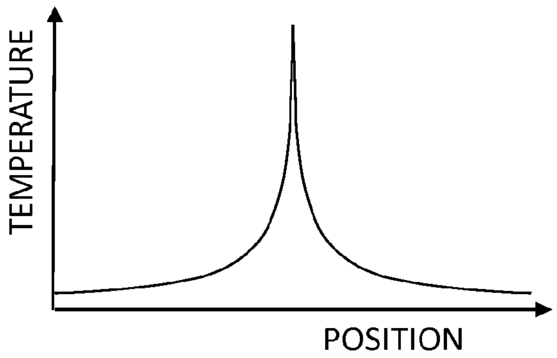
FIG. 9 is a diagram showing an example of the relationship between temperature distribution and temperature due to irradiation of one beam to a region equivalent to one beam pitch in a comparative example of the first embodiment.

FIG. 9 is a diagram showing an example of the relationship between temperature distribution and temperature due to irradiation of one beam to a region equivalent to one beam pitch in a comparative example of the first embodiment. In FIG. 9, the vertical axis represents temperature, and the horizontal axis represents temperature distribution. As shown in FIG. 9, the temperature distribution due to irradiation of one beam has a wide base region. Accordingly, a wide range is affected. However, as for the influence on the base region, the temperature rise caused by one beam is small, only 0.01° C. or less.

Figure 10:
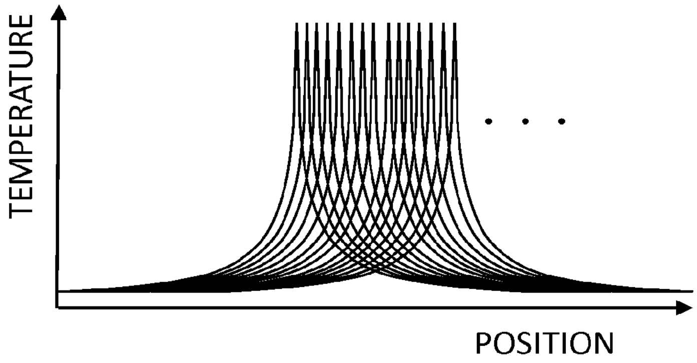
FIG. 10 is a diagram showing an example of the relationship between temperature distribution and temperature due to simultaneous irradiation of multiple beams in the first embodiment.

FIG. 10 is a diagram showing an example of the relationship between temperature distribution and temperature due to simultaneous irradiation of multiple beams in the first embodiment. In FIG. 10, the vertical axis represents temperature, and the horizontal axis represents temperature distribution. The temperature rise caused by one beam is only 0.01° ° C. or less, but when, for example, 500×500=250,000 beams are simultaneously emitted, the temperature rises caused by the respective beams overlap in the base region as shown in FIG. 10. As a result, when, for example, 500×500=250,000 beams are simultaneously emitted, the temperature rises are significant in the base region.

Although a technique related to heating effect prediction/correction in one-beam writing using a single beam is known, heating effect correction in a multiple-beam writing method in which, for example, 250,000 multiple beams are simultaneously shot many times per one stage path is unprecedented. It is not realistic to calculate the heat produced by each of, for example, 250,000 beams in the same manner as the calculation for a single beam because of the calculation volume.

In multiple beams, a current density J is extremely small as compared to a single beam in, for example, the VSB system, and thus the temperature rises slowly. In the meantime, the temperature distribution by one shot has diffused by several tens μm. Therefore, even if the shot data and the dose data within the stripe are divided and collectively calculated to some extent, sufficient accuracy can be obtained. In addition, since a raster scan system is used in the multiple-beam writing as described above, the position is determined by time. Accordingly, once the dose data and the writing speed (stage speed or tracking cycle time) are determined, the rising temperature is determined. It is possible to perform correction simpler than the VSB system that requires both position and time.

For this reason, in the first embodiment, the dose information on the stripe region 32 is allocated to information on certain M×N pixels including a mesh of interest for which the temperature is to be determined. For the mesh of interest, the dose information before and after the region and parameters for determining the proceeding speed of writing such as the tracking cycle time are used as input to calculate the temperature at the time of beam irradiation of each time divided into a plurality of times. Then, the statistical value (for example, the average value) is used for correction as an effective temperature. The following is a specific description.

Figure 11:
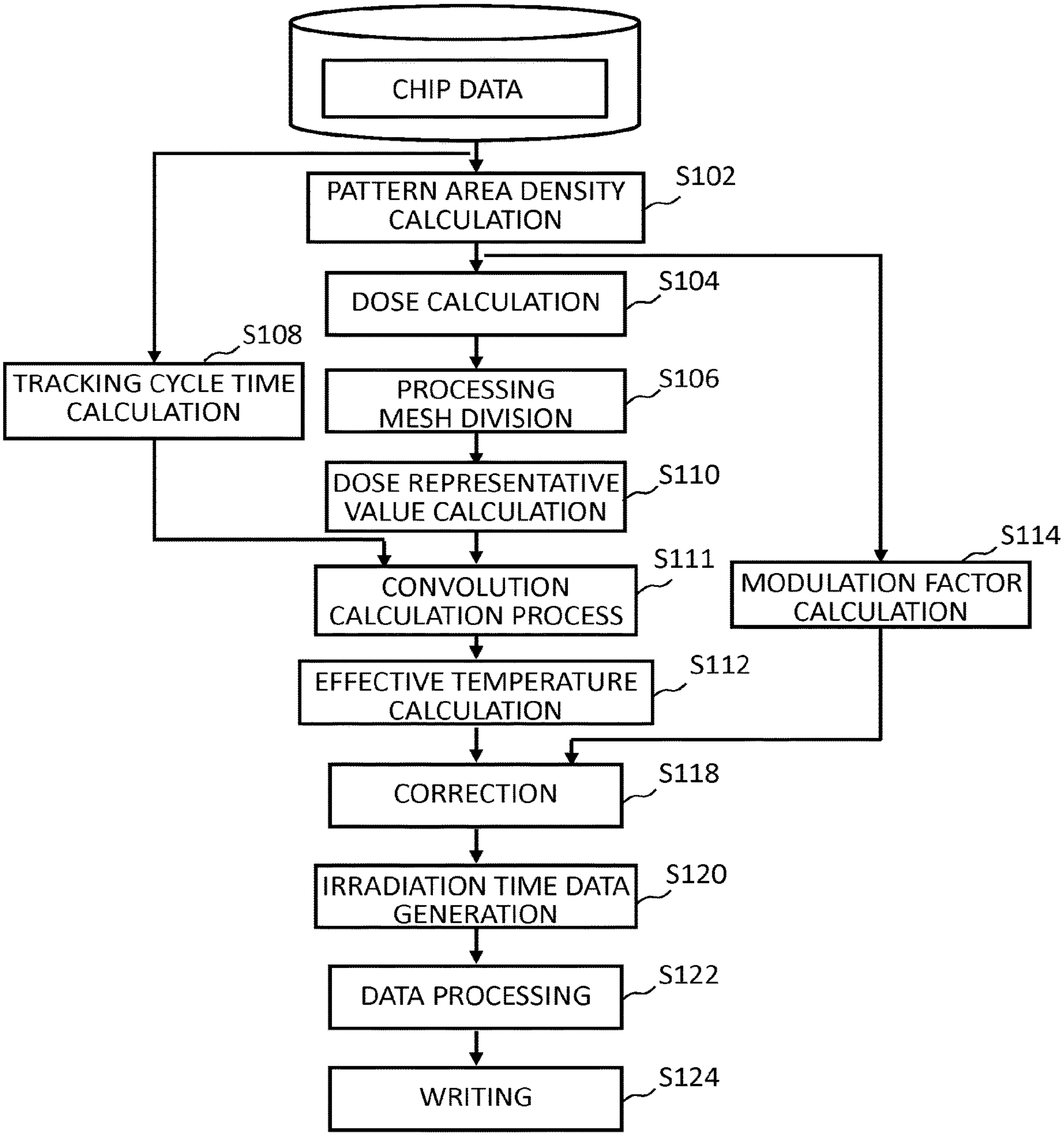
FIG. 11 is a flowchart showing an example of essential steps of a writing method in the first embodiment.

FIG. 11 is a flowchart showing an example of essential steps of a writing method in the first embodiment. In FIG. 11, the writing method according to the first embodiment performs a series of steps including a pattern area density calculating step (S102), a dose calculating step (S104), a processing mesh dividing step (S106), a tracking cycle time calculating step (S108), a dose representative value calculating step (S110), a convolution calculation processing step (S111), an effective temperature calculating step (S112), a modulation factor calculating step (S114), a correcting step (S118), a beam irradiation time data generating step (S120), a data processing step (S122), and a writing step (S124).

First, writing data is read from the storage device 140 for each stripe region 32.

As the pattern area density calculating step (S102), the pattern area density calculator unit 50 calculates a pattern area density p (density of the pattern area) for each pixel 36 in the target stripe region 32. The pattern area density calculator unit 50 creates a pattern area density map for each stripe region 32 using the calculated pattern area density p of each pixel 36. The pattern area density of each pixel 36 is defined as each element of the pattern area density map. The created pattern area density map is stored in the storage device 144.

As the dose calculating step (S104), the dose calculator unit 52 calculates, for each pixel 36, a dose for irradiating the pixel 36. The dose may be calculated as, for example, a value obtained by multiplying a preset base dose Dbase by a proximity effect correction dose coefficient Dp and the pattern area density ρ. As described above, the dose is preferably determined in proportion to the pattern area density calculated for each pixel 36. For the proximity effect correction dose coefficient Dp, the writing region (here, for example, the stripe region 32) is virtually divided into a plurality of proximity mesh regions (proximity effect correction calculation mesh regions) in a mesh shape by a predetermined size. The size of the proximity mesh region is preferably set to about 1/10 of the range of influence of the proximity effect, for example, about 1 μm. Then, the writing data is read from the storage device 140, and a pattern area density ρ' of the pattern arranged in each proximity mesh region is calculated for the proximity mesh region.

Next, the proximity effect correction dose coefficient Dp for correcting the proximity effect is calculated for each proximity mesh region. Here, the size of the mesh region for which the proximity effect correction dose coefficient Dp is calculated is not necessarily the same as the size of the mesh region for which the pattern area density ρ' is calculated. The correction model of the proximity effect correction dose coefficient Dp and the calculation method thereof may be the same as the method used in a conventional single-beam writing method.

Then, the dose calculator unit 52 creates, for each stripe region 32, a dose map (1) using the calculated dose for each pixel 36. The dose for each pixel 36 is defined as each element of the dose map (1). In the example described above, the dose is calculated as the absolute value multiplied by the base dose Dbase, but is not limited thereto. The dose may be calculated as a relative value with respect to the base dose Dbase, assuming that the base dose Dbase is 1. In other words, the dose may be calculated as a coefficient value obtained by multiplying the proximity effect correction dose coefficient Dp and the pattern area density ρ. The created dose map (1) is stored in the storage device 144.

As the processing mesh dividing step (S106), the divider unit 53 (division processing circuit) divides each stripe region of a plurality of stripe regions obtained by dividing the writing region of the target object by the size of the y direction (first direction) of the beam array region of the multiple charged particle beams on the surface of the target object in the y direction into a plurality of mesh regions in the y direction and the x direction (second direction) that is the movement direction of the stage along each stripe region. Specifically, the divider unit 53 (division processing circuit) divides each stripe region 32 into a plurality of processing meshes (mesh regions) by a size of 1/N (N is an integer of 2 or more) of the size W of the beam array region in, for example, the y direction (first direction) and the x direction (second direction) orthogonal to the y direction.

Figure 12:
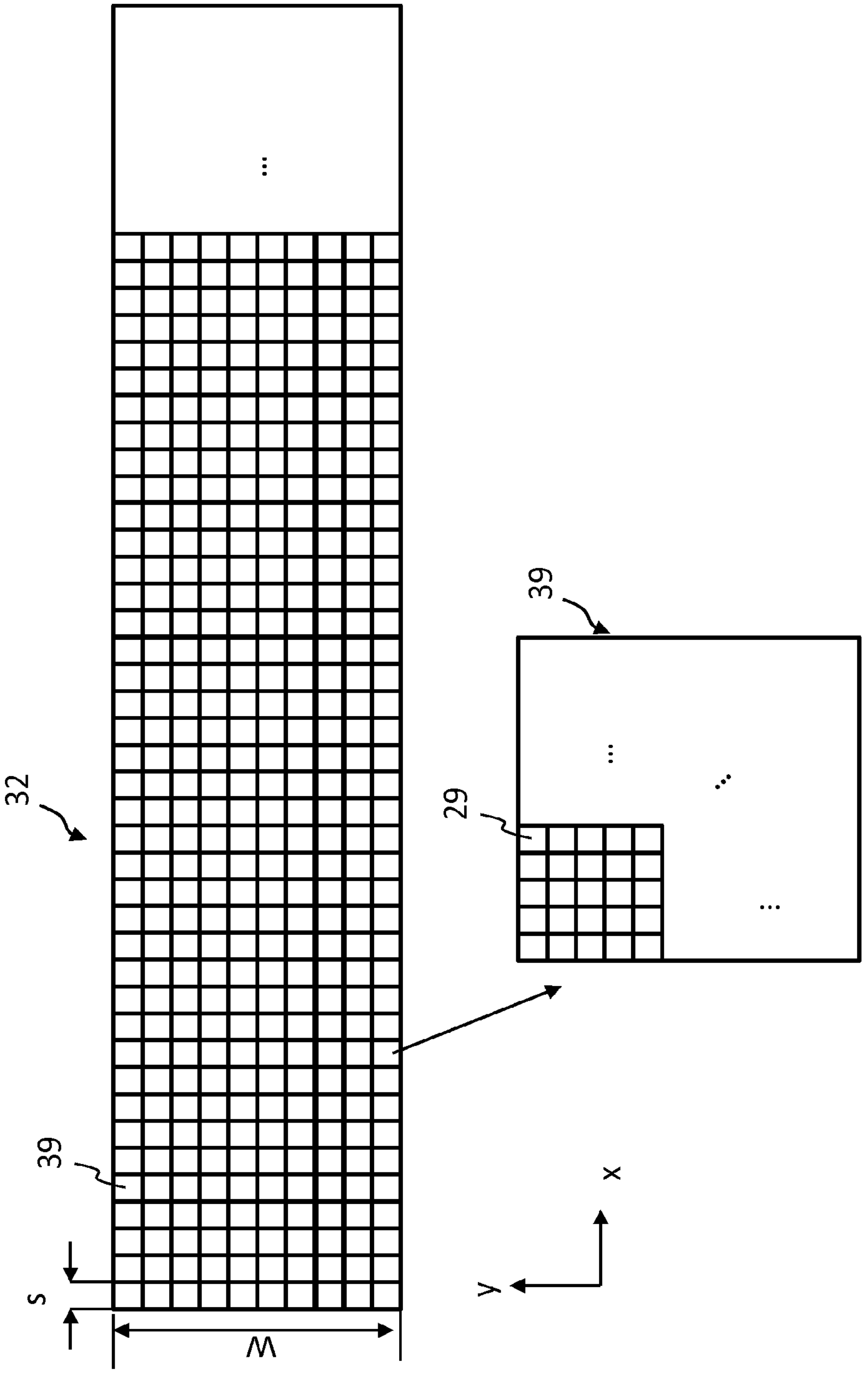
FIG. 12 is a diagram showing an example of a processing mesh in the first embodiment.

FIG. 12 is a diagram showing an example of a processing mesh in the first embodiment. As described above, the writing region 30 of the target object 101 is divided into a plurality of stripe regions 32 in the y direction by, for example, the size W of the irradiation region 34 (beam array region) of the multiple beams 20 on the surface of the target object 101. Then, each stripe region 32 is divided into a plurality of processing meshes (mesh regions) 39 by a size of 1/N (N is an integer of 2 or more) of the size W of the irradiation region 34 (beam array region). The size s of each processing mesh 39 is configured to be larger than the sub-irradiation region 29 with the beam pitch size.

In the first embodiment, the size s of the processing mesh 39 is preferably set to, for example, the tracking distance L. The tracking distance L is k times (k is a natural number) the inter-beam pitch size on the surface of the target object 101. In the above-described example, the tracking distance L is set to, for example, 25 times the inter-beam pitch size. Accordingly, the size s of the processing mesh 39 is preferably set to, for example, a size equivalent to 25 beam pitches. As described above, the size s of the processing mesh 39 is larger than the inter-beam pitch size on the surface of the target object 101. Furthermore, the processing mesh 39 is a sufficiently large region with respect to the pixel 36 which is a unit region to be irradiated with each beam.

As the tracking cycle time calculating step (S108), the tracking cycle time calculator unit 56 calculates a tracking cycle time $t_{trk\text{-}cycle}$. The tracking cycle time $t_{trk\text{-}cycle}$ can be determined by dividing the tracking distance L by a stage speed v as expressed in the following Expression (1). Here, the speed v when the XY stage 105 moves at a constant speed during the writing in the stripe region 32 is used. Note that, since the size s of the processing mesh 39 is L, the tracking cycle time $t_{trk\text{-}cycle}$ can be determined by dividing the size s of the processing mesh 39 by the stage speed v as expressed in the following Expression (1-1). In addition, since the size s of the processing mesh 39 is 1/N of the width of the stripe region 32 that is the width W of the beam array region, the tracking cycle time $t_{trk\text{-}cycle}$ can be determined by dividing 1/N of the width W of the beam array region by the stage speed v as expressed in the following Expression (1-1).

[Math. 1]

$$t_{trk\text{-}cycle} = L/v = s/v = (W/N)/v \tag{1-1}$$

As the dose representative value calculating step (S110), the dose representative value calculator unit 54 (dose statistical value calculation circuit) calculates, for each divided processing mesh 39, a representative value of a plurality of doses of a plurality of beams with which the inside of the processing mesh 39 is irradiated as a dose representative value D. The processing mesh 39 includes a plurality of sub-irradiation regions 29. As described above, each sub-irradiation region 29 is irradiated with a plurality of different beams. In the above example, for example, irradiation is performed with 10 different beams each separated by 25 beam pitches in the x direction, and a plurality of pixels 36 is included in the processing mesh 39. Here, the representative value (dose representative value Dij) of the dose defined for all the pixels 36 in the processing mesh 39 is calculated. The representative value is, for example, an average value, a maximum value, a minimum value, or a median value. Here, an average dose that is an average value is calculated as the dose representative value Dij, for example. The dose representative value calculator unit 54 creates a dose representative value map using the calculated dose representative value Dij of each processing mesh 39. The dose for each processing mesh 39 is defined as each element of the dose representative value map. Note that, i indicates an index of the processing mesh 39 in the x direction. In addition, j represents an index of the processing mesh 39 in the y direction. The created dose representative value map is stored in the storage device 144.

As the convolution calculation processing step (S111), the convolution calculation processing unit 57 performs a calculation process of a rising temperature given by heat due to beam irradiation to each processing mesh 39 in the processing region corresponding to the beam array region to a mesh region of interest, which is one of the plurality of processing meshes 39. This calculation process is performed by a convolution process using the dose representative value for each processing mesh 39 and a thermal spread function representing the thermal spread generated by the processing mesh 39.

As the effective temperature calculating step (S112), the effective temperature calculator unit 58 (effective temperature calculation circuit) performs a repetitive process of repeating the above calculation process while shifting the position of the processing region corresponding to the beam array region in the x direction on the stripe region, and calculates, as the effective temperature of the mesh region of interest, a representative value of a plurality of rising temperatures obtained by performing this repetitive process a plurality of times until the position of the processing mesh 39 reaches, from one end of this processing region in the x direction, the other end. Specifically, the effective temperature calculator unit 58 (effective temperature calculation circuit) calculates, for each processing mesh 39, the effective temperature using the dose statistical value Dij for each processing mesh 39 and a thermal spread function PSF representing the thermal spread generated by each mesh. The thermal spread function PSF can be defined by the following Expression (1-2) as, for example, a general heat diffusion equation.

[Math. 2]

$$\frac{\partial T}{\partial t} = \lambda\left(\frac{\partial^2 T}{\partial x^2} + \frac{\partial^2 T}{\partial y^2} + \frac{\partial^2 T}{\partial z^2}\right) \tag{1-2}$$

A function representing the surface temperature of a quartz glass substrate determined from Expression (1-2) can be used. Here, A represents a thermal diffusivity of a substance whose temperature diffuses. An example of the solution of the above expression will be described later as a description of Expression (3-1).

Using the dose statistical value Dij and the thermal spread function PSF, for example, a convolution process of calculating a rising temperature given to a mesh region of interest by heat due to beam irradiation to each processing mesh 39 in a processing region that is a rectangular region with the same size as the beam array region constituted by the N×N processing meshes 39 is performed while shifting the position of the rectangular region in the x direction on the target stripe region 32 by the size s of the processing mesh 39 until the mesh region of interest is included in the rectangular region. The effective temperature calculator unit 58 performs this process N times until the position of the mesh region of interest reaches, from one end of the rectangular region in the x direction, the other end. Then, the effective temperature calculator unit 58 calculates a statistical value of the results of the convolution processes performed N times as an effective temperature T(k, l).

Figure 13:
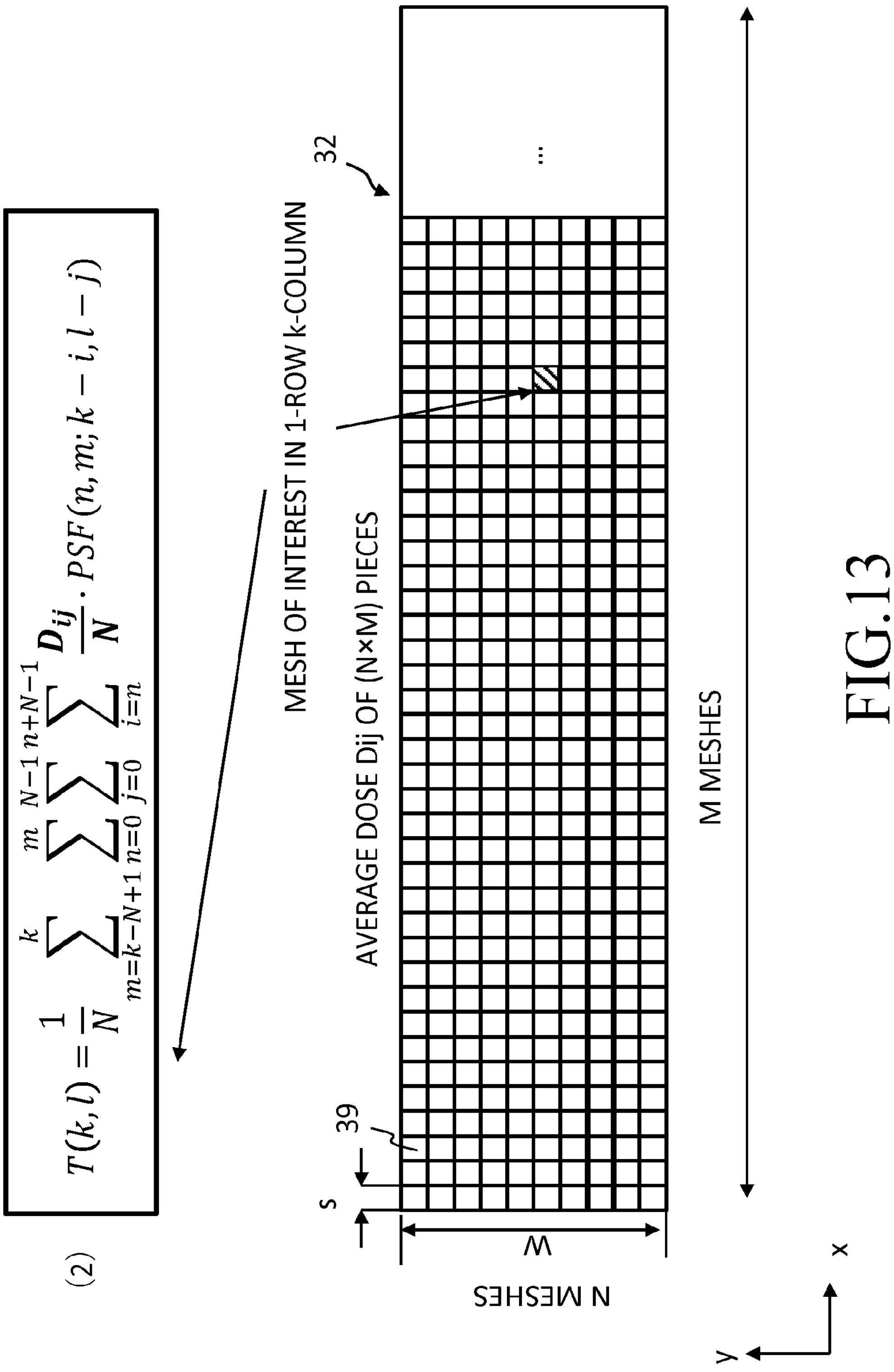
FIG. 13 is a diagram for explaining a calculation method of an effective temperature in the first embodiment.

FIG. 13 is a diagram for explaining a calculation method of an effective temperature in the first embodiment. The effective temperature T(k, l) can be defined by Expression (2) shown in FIG. 13. In the stripe region 32, M processing meshes are arranged in the x direction and N processing meshes 39 are arranged in the y direction. In Expression (2), among the processing meshes 39 in the stripe region 32, the processing mesh 39 in the l-th row in the y direction and the k-th column in the x direction is shown as the mesh region of interest.

In Expression (2), i represents an index in the x direction in the dose statistical value map. It is defined as an index i=0 of the left end processing mesh 39 of the stripe region 32 in the x direction.

In addition, j represents an index in the y direction in the dose statistical value map. It is defined as an index j=0 of the lowermost processing mesh 39 of the stripe region 32 in the y direction.

N represents the number of meshes of the input dose map in the vertical direction (y direction) used for the effective temperature calculation.

M represents the number of meshes of the input dose map in the lateral direction (x direction) used for the effective temperature calculation.

In addition, (k, l) indicates an index (reference number) of the processing mesh (mesh region of interest) for which the effective temperature T in the (M×N) processing meshes is calculated.

Dij indicates the dose statistical value of the processing mesh 39 assigned to the index (k, l) in the dose statistical value map. (μC/cm^2)

Here, m represents l−N+1 to l-th tracking reset number to be performed until the beam array region (N×N) passes through the mesh of interest (k, l). When m=l−N+1, the mesh of interest is positioned at the right end of the (N×N) beam array region. When m=l, the mesh of interest is positioned at the left end.

In addition, n represents the 0th to m-th tracking reset number.

In the first tracking control (tracking cycle), the tracking is not yet reset, and the tracking reset number is zero. In the second tracking control, the tracking is reset once, and the tracking reset number is 1.

PSF (n, m, k−i, l−j) represents the thermal spread function.

Figure 14:
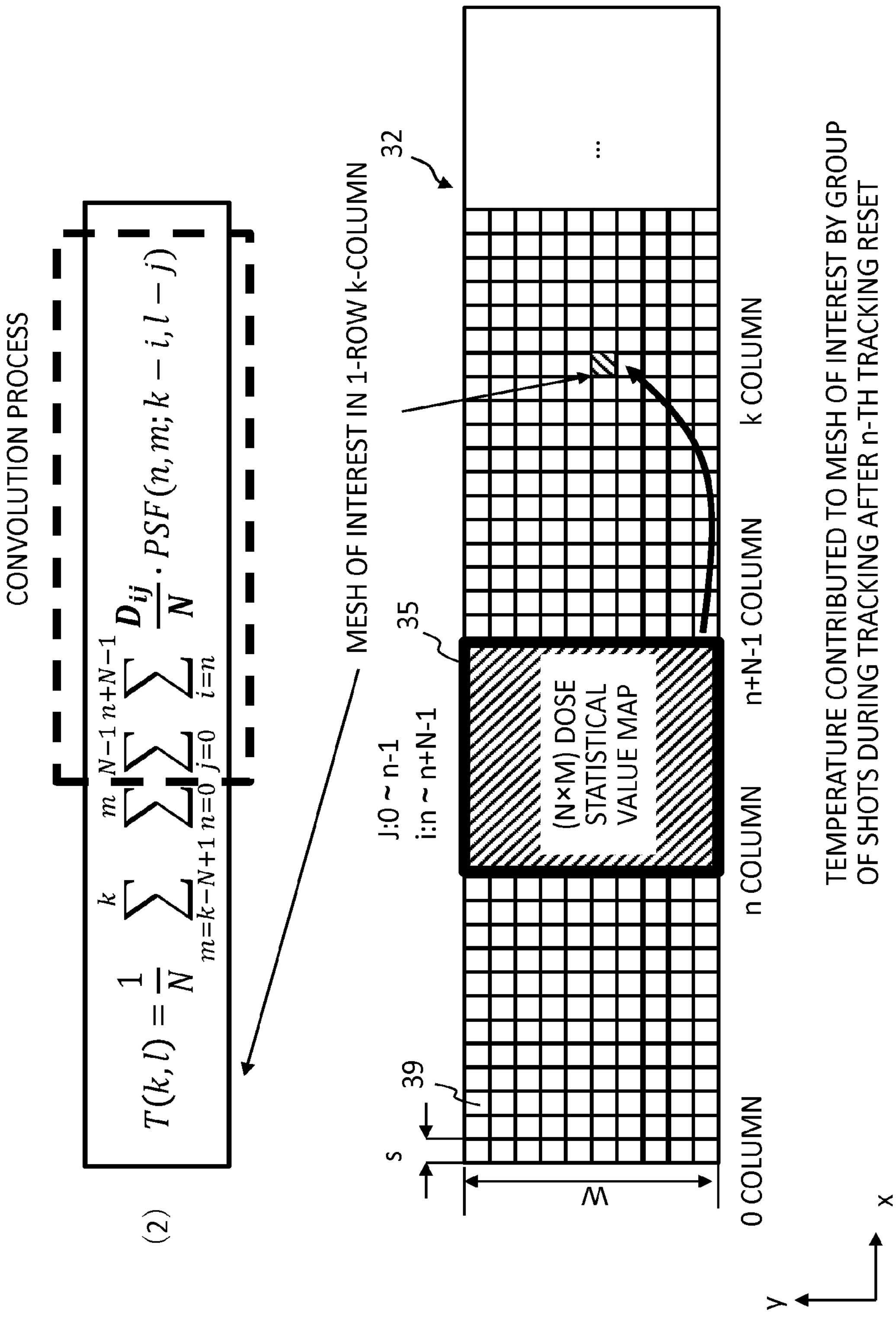
FIG. 14 is a diagram for explaining a part of a calculation expression for the effective temperature in the first embodiment.

FIG. 14 is a diagram for explaining a part of a calculation expression for the effective temperature in the first embodiment. In FIG. 14, the part surrounded by the dotted line in Expression (2) indicates a calculation part in the convolution process. In the calculation part in the convolution process of Expression (2), a convolution process of calculating a rising temperature given to the mesh region of interest at the index (k, l) by heat due to beam irradiation to each mesh region in the rectangular region 35 with the same size as the beam array region including the N×N processing meshes 39 is performed. The rectangular region 35 in which the left end of the rectangular region 35 is the n-th column of the processing meshes 39 and the right end is the n+N−1th column of the processing meshes 39 is used. Accordingly, N×N processing meshes 39 corresponding to the n-th to n+N−1th columns in the x direction and the 0th to N−1th rows in the y direction are arranged in the rectangular region 35.

FIG. 15 is a diagram for explaining an example of a calculation expression for a thermal spread function in the first embodiment. The thermal spread function PSF (n, m, k−i, l−j) is defined by Expression (3-1) shown in FIG. 15. Expression (3-1) can be determined by solving the heat conduction equation under the boundary condition of infinite in the XY direction and of semi-infinite in the substrate depth direction in the Z direction under the initial condition when uniform heat due to beam irradiation is applied to the volume obtained by multiplying the mesh size on the substrate surface by Rg.

Symbols in the thermal spread function PSF (n, m, k−i, l−j) that overlap with Expression (2) are similar to the Expression (2). The thermal spread function PSF (n, m, k−i, l−j) shown in FIG. 15 is defined based on a case where the XY stage 105 moves at a constant speed in, for example, the direction (−x direction) opposite to the x direction that is the writing direction. As shown in FIG. 15, the thermal spread function PSF (n, m, k−i, l−j) is defined using the tracking cycle time determined by the speed v of the XY stage 105.

In Expression (3-1), Rg represents the range of a 50 kV electron beam in quartz. For example, the range $Rg=(0.046/\rho)E^{1.75}$ is used.

In addition, ρ represents the density (for example, 2.2 g/cm^3) of the substrate (quartz).

In addition, σn, m represents a function determined by the number tracking resets (m−n) performed from the n-th to the m-th. The function σn, m is defined by Expression (3-3).

The function A is defined in Expression (3-2).

In Expression (3-2), V represents the acceleration voltage of the electron beam.

In addition, Cp represents specific heat (for example, 0.77 J/g/K) of the substrate (quartz).

In Expression (3-3), λ represents the thermal diffusivity (for example, 0.0081 cm^2/sec) of the substrate (quartz).

In addition, (m−n) indicates the number of tracking resets performed from the n-th to the m-th.

In addition, $t_{trk\text{-}cycle}$ represents the tracking cycle time. The tracking cycle time $t_{trk\text{-}cycle}$ is expressed by Expression (3-4). This is similar to Expression (1).

In addition, $v_{stage}$ represents the stage speed v.

Normally, a multiple-beam writing apparatus is optimized to finish shots (10 shots in the above example) during tracking at a certain stage speed $v_{stage}$=(constant) in the stage path. Since the tracking distance L (=W/N) is tracked at the stage speed, the tracking cycle time $t_{trk\text{-}cycle}$ can be defined by Expression (1-1).

Figure 16:
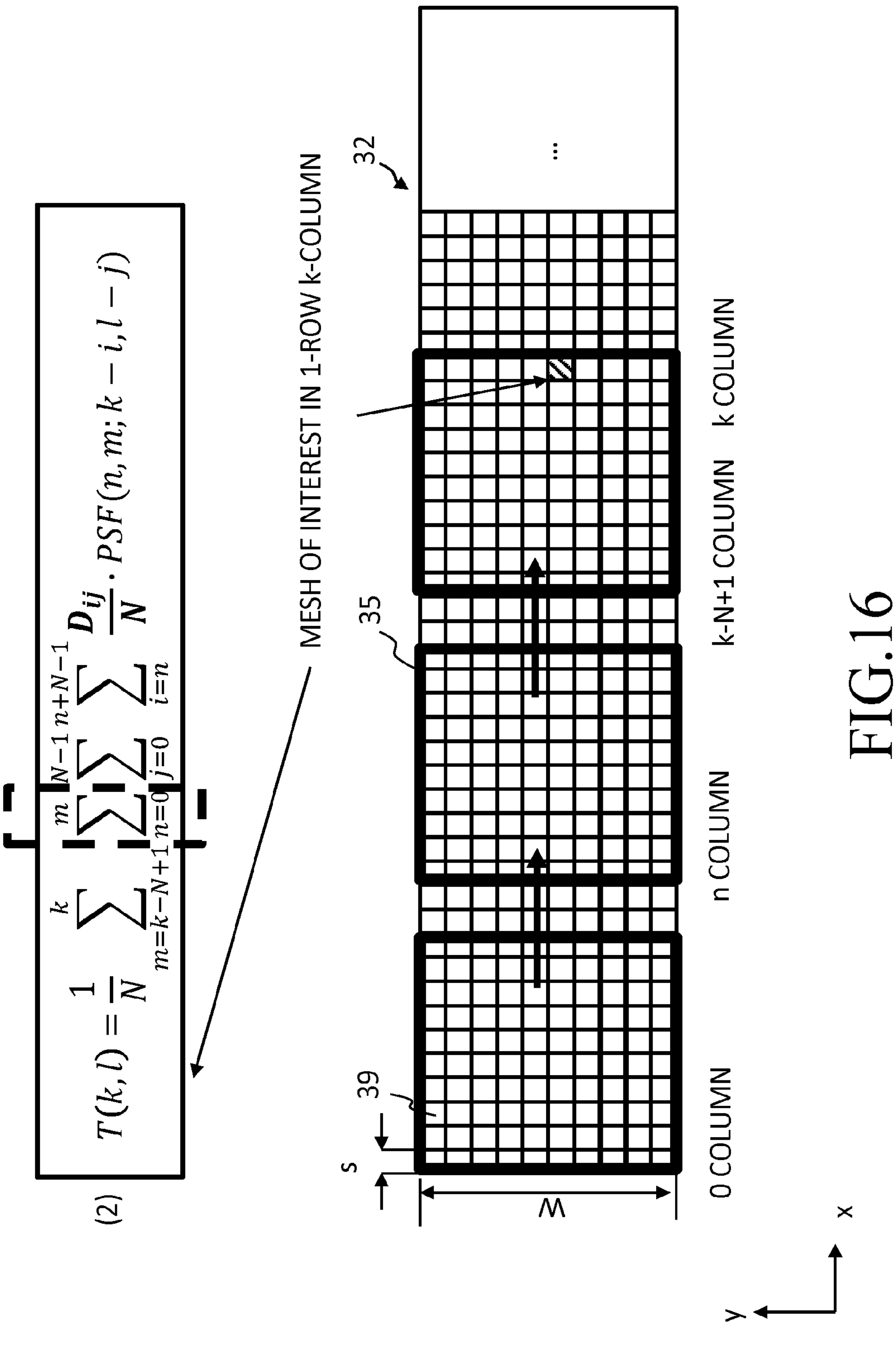
FIG. 16 is a diagram for explaining another part of the calculation expression for the effective temperature in the first embodiment.

FIG. 16 is a diagram for explaining another part of the calculation expression for the effective temperature in the first embodiment. The convolution process described in FIG. 14 is performed while shifting the position of the rectangular region 35 in the x direction from the left end (n=0) of the stripe region 32 by the size s of the processing mesh 39 until the mesh region of interest at the index (k, l) is included in the rectangular region 35 (n=m). This process is indicated by the calculation part surrounded by the dotted line of Expression (2) shown in FIG. 16. The example of FIG. 16 shows a case where the rectangular region 35 is moved to a state where the mesh region of interest at the index (k, l) is positioned at the right end of the rectangular region 35. In this state, the left end of the rectangular region 35 is positioned in the k−N+1th column, and the right end is positioned in the k-th column.

Figure 17:
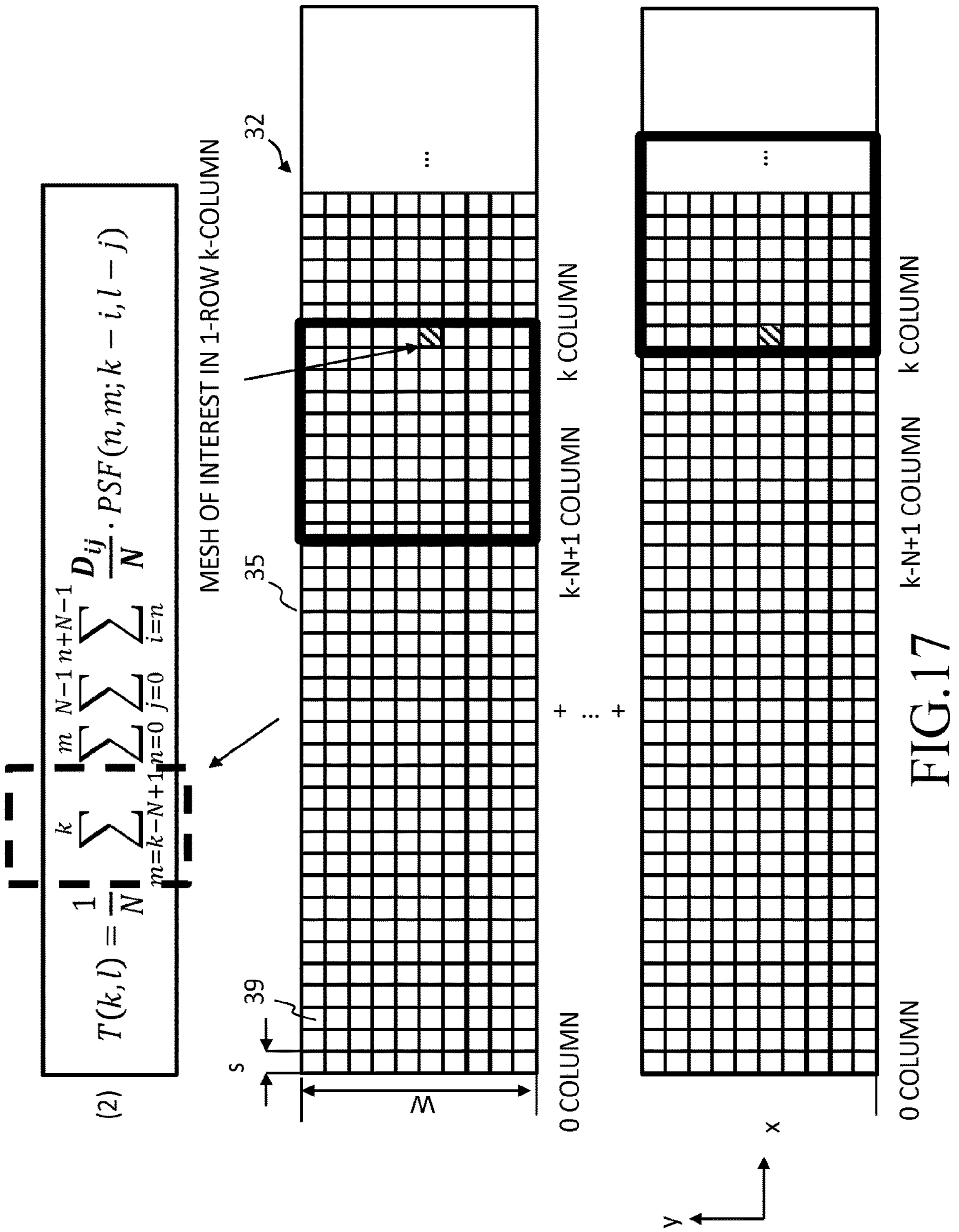
FIG. 17 is a diagram for explaining another part of the calculation expression for an effective temperature in the first embodiment.

FIG. 17 is a diagram for explaining another part of the calculation expression for the effective temperature in the first embodiment.

FIG. 18 is a diagram for explaining another part of the calculation expression for the effective temperature in the first embodiment. FIG. 18 shows a specific expression for the process to be performed by the calculation part of FIG. 17.

The process shown in FIG. 16 is performed N times until the position of the mesh region of interest reaches, from the right end which is one end of the rectangular region 35 in the x direction, the left end which is the other end as shown in FIG. 17. In other words, as shown in FIG. 18, the processes of the process from n=0 to n=m=k−N+1 shown in FIG. 16, the process from n=0 to n=m=k−N+2 shown in FIG. 16, the process from n=0 to n=m=k−N+3 shown in FIG. 16, . . . , and the process from n=0 to n=m=k shown in FIG. 16 are performed N times, and the total thereof is calculated. Since the N processing meshes 39 are arranged in the rectangular region 35 in the x direction, the processes are performed N times until the mesh region of interest reaches, from the right end of the rectangular region 35, the left end. This process is indicated by the calculation part surrounded by the dotted line of Expression (2) shown in FIG. 17. Then, a statistical value of the results of convolution processes performed N times is calculated as the effective temperature T(k, l). This process is indicated by the calculation part surrounded by the dotted line of Expression (2) shown in FIG. 18. The example of Expression (2) shows a case where the average value obtained by dividing the total of the convolution processes performed N times by N is calculated as the effective temperature T(k, l).

Note that the number of divisions of the rectangular region and the number of calculation processes do not necessarily have to match. That is, the rectangular region may be divided into N pieces, and the number of calculation processes may be smaller than N (down-sampling). Alternatively, the rectangular region may be divided into N pieces and distributed to a number of meshes greater than N (up-sampling).

The effective temperature T(k, l) is not limited to an average value, and may be a maximum value, a minimum value, or a median value of results of the convolution processes performed N times. The median value is desirable. The average value is more desirable.

The position of the mesh region of interest is changed, and the effective temperature T(i, j) is determined for each position (i, j) of the processing mesh 39.

As described above, in the first embodiment, instead of calculating the temperature rise for each shot and each beam, the effective temperature T(i, j) in units of the processing mesh 39 is calculated using the dose statistical value Dij of the processing mesh 39. The effective temperature T(i, j) can be calculated for each processing mesh 39 that is sufficiently large as compared to the pixel 36 serving as a unit region of beam irradiation for each shot. Accordingly, the calculation amount can be greatly reduced.

As the modulation factor calculating step (S114), the modulation factor calculator unit 60 calculates a modulation factor α(x) of the dose depending on the effective temperature T.

Figure 19:
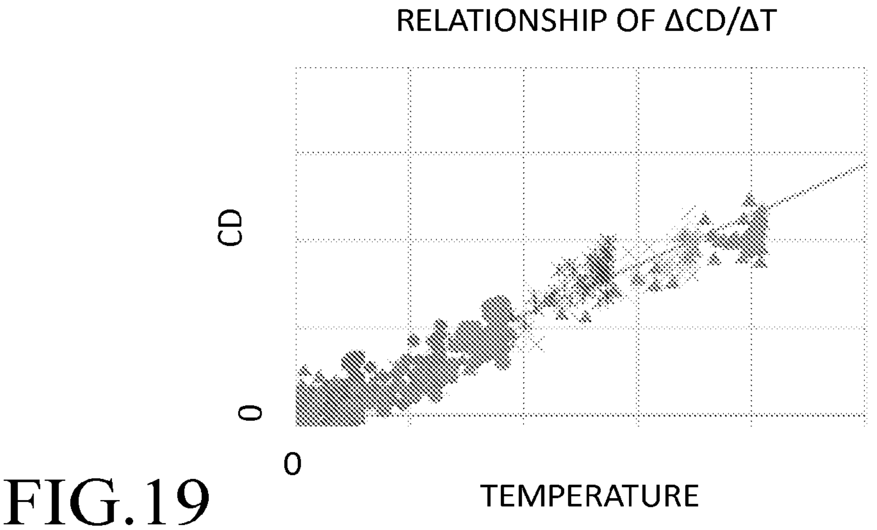
FIG. 19 is a diagram showing an example of the relationship between a line width CD and temperature in the first embodiment.

FIG. 19 is a diagram showing an example of the relationship between a line width CD and temperature in the first embodiment. In FIG. 19, the vertical axis represents line width critical dimension (CD), and the horizontal axis represents temperature. FIG. 19 shows that as the temperature of resist increases, the deviation of the line width CD also increases. The CD variation ΔCD/ΔT [nm/K] due to heating effect has a linear relationship. Since this value varies depending on the type of resist and the type of substrate, the values are acquired by conducting experiments on them. Therefore, an approximate expression approximating the CD change amount ΔCD per unit temperature ΔT is determined. The correlation data (1) is externally input and stored in the storage device 144.

Figure 20:
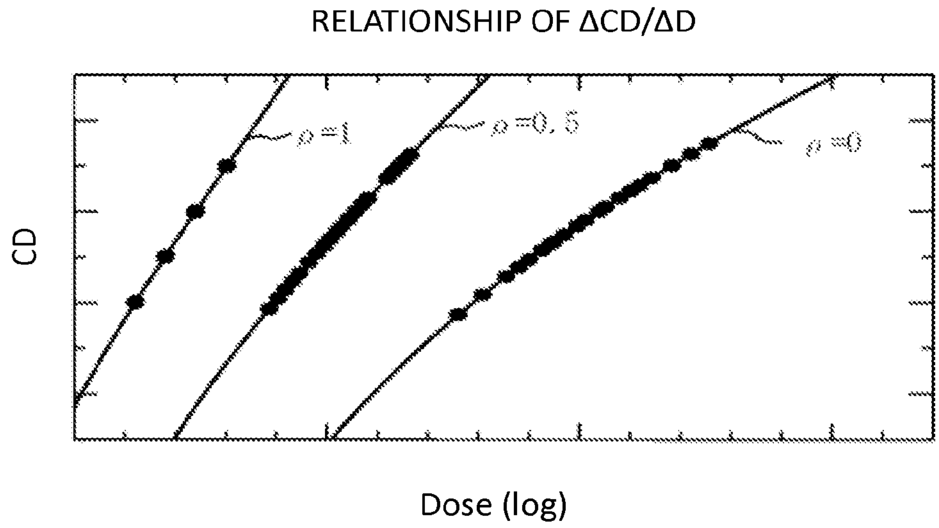
FIG. 20 is a diagram showing an example of the relationship between a line width CD and dose in the first embodiment.

FIG. 20 is a diagram showing an example of the relationship between a line width CD and dose in the first embodiment. In FIG. 20, the vertical axis represents line width CD, and the horizontal axis represents dose. The example of FIG. 20 is shown using logarithms on the horizontal axis. As shown in FIG. 20, the line width CD depends on the pattern area density, and the line width CD increases as the dose increases. The relationship ΔCD/ΔD between the CD variation depending on each pattern area density and the dose is obtained through experiments for each resist/substrate type. Then, an approximate expression approximating the CD change amount ΔCD per unit dose is determined. The correlation data (2) is externally input and stored in the storage device 144.

The modulation factor calculator unit 60 reads the correlation data (1) and (2) from the storage device 144, and calculates the dose change amount ΔD per unit temperature ΔT depending on the pattern area density as the modulation factor α(x) of the dose depending on the effective temperature T. The modulation factor α(x) depending on the pattern area density p is defined by the following Expression (5).

$$\alpha(x) = (\Delta CD/\Delta T)/(\Delta CD/\Delta D)_{\rho} = (\Delta D/\Delta T)_{\rho} \qquad (5)$$

As the correcting step (S118), the corrector unit 62 (dose correction circuit) corrects the dose of a plurality of beams with which each mesh region of interest is irradiated using the effective temperature T(i, j). The correction amount can be determined as a value determined by multiplying the effective temperature T(i, j) by the modulation factor α(x). The corrected dose D'(x) can be determined by the following Expression (6). Note that, x indicates an index of the pixel 36. In addition, (i, j) indicates an index of the processing mesh. As the pattern area density ρ, the pattern area density of the target pixel 36 may be used.

$$D'(x) = D(x) - T(i, j) \times \alpha(x) \qquad (6)$$

Then, the corrector unit 62 creates a dose map (2) using the calculated corrected dose D'(x) of each pixel 36 for each stripe region 32. The dose D'(x) of each pixel 36 is defined as each element of the dose map (2). As a result, the corrected (modulated) dose distribution D'(x) is determined. That is, the CD size of the temperature rise can be returned to the design size. The created dose map (2) is stored in the storage device 144.

As the beam irradiation time data generating step (S120), the beam irradiation time data generator unit 72 calculates, for each pixel, the beam irradiation time t of the electron beam for causing the corrected dose D'(x) calculated for the pixel 36 to be incident on the pixel 36. The beam irradiation time t can be calculated by dividing the dose D'(x) by the current density J. When the dose D(x) before correction defined in the dose map (1) is a relative value (a coefficient value of dose) with respect to the base dose Dbase calculated by assuming that the base dose Dbase is 1, the dose statistical value Dij of each processing mesh 39 is also calculated as a relative value with respect to the base dose Dbase. Therefore, the effective temperature T(i, j) of each processing mesh 39 is also calculated as a relative value with respect to the base dose Dbase. Accordingly, in such a case, the beam irradiation time t can be calculated by dividing, by the current density J, a value obtained by multiplying the dose D'(x) by the base dose Dbase.

The beam irradiation time t of each pixel 36 is calculated as a value within the maximum beam irradiation time Ttr during which irradiation with one shot of the multiple beams 20 can be performed. The beam irradiation time t of each pixel 36 is converted into gradation value data from 0 to 1023 gray scale levels in which the maximum beam irradiation time Ttr is, for example, 1023 gray scale levels (10 bits). The beam irradiation time data converted to the gradation by gray scale levels is stored in the storage device 142.

As the data processing step (S122), the data processing unit 74 rearranges the beam irradiation time data in shot order in accordance with the writing sequence and rearranges the beam irradiation time data in data transfer order in consideration of the arrangement order of the shift resisters of each group.

As the writing step (S124), the transfer controller unit 79 transfers the beam irradiation time data to the deflection control circuit 130 in shot order under the control of the writing controller unit 80. The deflection control circuit 130 outputs a blanking control signal to the blanking aperture array mechanism 204 in shot order, and outputs a deflection control signal to the DAC amplifier units 132 and 134 in shot order. Then, the writing mechanism 150 writes a pattern on the target object 101 using the multiple beams 20 with the dose D'(x) corrected using the effective temperature T(i, j).

The above example has described a case where the writing process is sequentially performed for the stripe region 32 for which the calculation of the dose D'(x) has been completed. For example, while the writing process in a certain stripe region 32 is performed, the dose D'(x) of the stripe region 32 one ahead or the stripe region 32 two ahead of the certain stripe region 32 is calculated in parallel with the writing process. In other words, it has been described a case where the dose D'(x) is calculated simultaneously with the writing process. However, the present invention is not limited thereto. As a pre-process before the writing process is started, the effective temperature T(i, j) and/or the dose D'(x) may be calculated.

As described above, according to the first embodiment, it is possible to correct resist heating without accumulating the influence of temperature rise for each shot and each beam in multiple-beam writing.

Second Embodiment

The first embodiment describes the case where the XY stage 105 is moved at a constant speed in the direction opposite to the writing direction during the writing in the stripe region 32, but the present invention is not limited thereto. In a second embodiment, a case where the XY stage 105 is moved at a variable speed is described. The configuration of the writing apparatus 100 according to the second embodiment is similar to that in FIG. 1. The essential steps of the writing method according to the second embodiment are similar to those in FIG. 11. The following description is similar to the first embodiment, except for the points specifically described.

Figure 21:
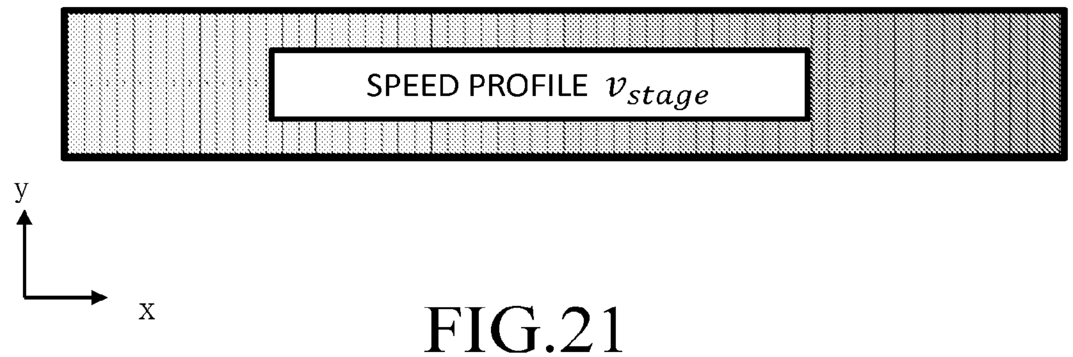
FIG. 21 is a diagram for explaining a stage speed profile in a second embodiment.

FIG. 21 is a diagram for explaining a stage speed profile in the second embodiment. FIG. 21 shows a case where the speed of the XY stage 105 changes at predetermined intervals in the x direction. The information on the speed profile is stored in the storage device 144. The speed profile may be calculated in the writing apparatus 100 or may be calculated outside the writing apparatus 100 and input to the writing apparatus 100. In the case of the calculation in the writing apparatus 100, a speed calculator unit (not shown) may be disposed in the control calculator 110.

FIG. 22 is a diagram for explaining an example of a calculation expression for a thermal spread function in the second embodiment. The thermal spread function PSF (n, m, k−i, l−j) is defined by Expression (3-1) shown in FIG. 22. In FIG. 22, Expressions (3-1) and (3-2) are similar to those in FIG. 15. The thermal spread function PSF (n, m, k−i, l−j) in the second embodiment is defined based on a case where the XY stage 105 moves at a variable speed in, for example, the direction (−x direction) opposite to the x direction that is the writing direction. As shown in FIG. 22, the thermal spread function PSF (n, m, k−i, l−j) is defined using the tracking cycle time determined from the speed v of the XY stage 105.

When the XY stage 105 is moved at a variable speed, the function σn, m is defined by Expression (7-1). In addition, the tracking cycle time can be defined by a value obtained by dividing the tracking distance L (=W/N) by the stage speed v. The size s of the processing mesh 39 is set to the tracking distance L. Accordingly, a tracking cycle time $t^{p}_{trk\text{-}cycle}$ is defined by Expression (7-2).

Note that, $v^{p}_{stage}$ indicates the variable stage speed v. In addition, p indicates the position of the constant speed section in the variable speed profile. The stage speed $v^{p}_{stage}$ is preferably set to be variable in speed in units of tracking distance L, for example. However, the present invention is not limited thereto. The speed may change during tracking. In this case, the constant speed section is set to be smaller than the tracking distance L. In addition, (m−n) indicates the number of tracking resets performed from the n-th to the m-th.

When the XY stage 105 is used at a variable speed, the speed changes for each section, and the tracking cycle time changes. Accordingly, when the XY stage 105 is used at a variable speed, as shown in Expression (7-1), in the route of the function σn, m, the total value of the tracking cycle times $t^{p}_{trk\text{-}cycle}$ from p=1 to P=(m−n) is multiplied by 4>, unlike the case of a constant speed.

The calculation of the effective temperature T in the second embodiment is similar to that in the first embodiment except for the thermal spread function to be used.

As described above, according to the second embodiment, it is possible to correct resist heating without accumulating the influence of temperature rise for each shot and each beam in multiple-beam writing when variable speed writing is performed.

Each of the above embodiments has described the case where the size s of the processing mesh 39 is adjusted to the tracking distance L, but the present invention is not limited thereto. The spread of heat due to heat transfer depends only on the distance (=time, for raster scan) between the mesh of interest and the mesh size that is considered to be irradiated with the uniform dose.

Accordingly, the size s of the processing mesh 39 can be used as a virtual tracking distance for calculating the effective temperature. Therefore, a value obtained by dividing the size s of the processing mesh 39 by the stage speed v can be used as a provisional tracking cycle time in calculation. Therefore, the above calculation expression of the thermal spread function can be used without modification.

Accordingly, the size s of the processing mesh 39 may be different from the tracking distance L. For example, it is suitable to set the size s of the processing mesh 39 to a value smaller than the tracking distance L. As a result, the temporal resolution of temperature diffusion and the spatial resolution of dose distribution in the effective temperature calculation expression are improved, and the accuracy of the effective temperature can be improved. However, the calculation amount of the effective temperature increases as the mesh size decreases, and it is practically sufficient to define the size s of the processing mesh 39 by the tracking distance L.

The embodiments have been described above with reference to specific examples. However, the present invention is not limited to these specific examples.

In addition, the description of the apparatus components, control methods, and other parts that are not directly necessary for the description of the present invention have been omitted, but required apparatus components and control methods can be selected and used as necessary. For example, the description of the controller unit components for controlling the writing apparatus 100 has been omitted, but it is obvious that a necessary controller unit component is appropriately selected and used.

In addition, all other multiple charged particle beam writing apparatuses and multiple charged particle beam writing methods that include the elements of the present invention and can be appropriately modified in design by those skilled in the art are included in the scope of the present invention.

INDUSTRIAL APPLICABILITY

The present invention relates to a multiple charged particle beam writing apparatus and a multiple charged particle beam writing method, and can be used, for example, for a correction method of resist heating that occurs in multiple-beam writing.

REFERENCE SIGNS LIST

20 Multiple beams
22 Hole
24 Control electrode
25 Passage hole
26 Counter electrode
28, 36 Pixel
29 Sub-irradiation region
30 Writing region
32 Stripe region
34 Irradiation region
35 Rectangular region
39 Processing mesh
41 Control circuit
46 Amplifier
47 Individual blanking mechanism
50 Pattern area density calculator unit
52 Dose calculator unit
53 Divider unit
54 Dose representative value calculator unit
56 Tracking cycle time calculator unit
58 Effective temperature calculator unit
60 Modulation factor calculator unit
62 Corrector unit
72 Beam irradiation time data generator unit
74 Data processing unit
79 Transfer controller unit
80 Writing controller unit
100 Writing apparatus
101 Target object
102 Electron optical column
103 Writing chamber
105 XY stage
110 Control calculator
112 Memory
130 Deflection control circuit
132, 134 DAC amplifier unit
136 Lens control circuit
138 Stage control mechanism
139 Stage position measuring device
140, 142, 144 Storage device
150 Writing mechanism
160 Control system circuit
200 Electron beam
201 Electron emission source
202 Illumination lens
203 Shaping aperture array substrate
204 Blanking aperture array mechanism
205 Reduction lens
206 Limiting aperture substrate
207 Objective lens
208 Main-deflector
209 Sub-deflector
210 Mirror
330 Membrane region
343 Pad

The invention claimed is:

1. A multiple charged particle beam writing apparatus configured to irradiate a writing region on a surface of a target object with multiple charged particle beams, the multiple charged particle beam writing apparatus comprising:

a divider circuit configured to divide each stripe region of a plurality of stripe regions obtained by dividing the writing region by a size of a first direction of a beam array region of multiple charged particle beams on the surface of the target object in the first direction into a plurality of mesh regions in the first direction and in a second direction that is a movement direction of a stage along the each stripe region;

a dose representative value calculator circuit configured to calculate, for each divided mesh region, a representative value of a plurality of doses of a plurality of beams with which an inside of the mesh region is irradiated as a dose representative value;

a calculation processing circuit configured to perform a calculation process of a rising temperature given to a mesh region of interest being one of the plurality of mesh regions by heat due to beam irradiation to each of the plurality of mesh regions in a processing region corresponding to the beam array region, the calculation process being performed by a convolution process using the dose representative value for each of the plurality of mesh regions and a thermal spread function representing thermal spread generated by the plurality of mesh regions;

an effective temperature calculator circuit configured to perform a repetitive process of repeating the calculation process while shifting a position of the processing region in the second direction on the stripe region and to calculate, as an effective temperature of the mesh region of interest, a representative value of a plurality of the rising temperatures obtained by performing the repetitive process a plurality of times until the mesh region of interest reaches, from one end of the processing region in the second direction, the other end;

a dose corrector circuit configured to correct, using the effective temperature, doses of a plurality of beams with which each mesh region of interest is irradiated; and a writing mechanism configured to include a movable stage on which the target object is placed and to write a pattern on the target object using the multiple charged particle beams having respective corrected doses.

2. The multiple charged particle beam writing apparatus according to claim 1, wherein the processing region is a region with the same size as the beam array region.

3. The multiple charged particle beam writing apparatus according to claim 1, wherein the thermal spread function is defined based on a case where the stage is moved in the stripe at a constant speed in a direction opposite to the second direction.

4. The multiple charged particle beam writing apparatus according to claim 1, wherein the thermal spread function is defined based on a case where the stage is moved at a variable speed in a direction opposite to the second direction.

5. The multiple charged particle beam writing apparatus according to claim 1, wherein the writing mechanism includes:

a deflector configured to perform tracking control by deflecting the multiple charged particle beams to follow the movement of the stage, and as a size of the mesh region, a tracking distance for performing the tracking control is used.

6. The multiple charged particle beam writing apparatus according to claim 5, wherein the thermal spread function is defined using a tracking cycle time determined by a speed of the stage.

7. The multiple charged particle beam writing apparatus according to claim 5, wherein the tracking distance is k times (k is a natural number) an inter-beam pitch size on the surface of the target object.

8. The multiple charged particle beam writing apparatus according to claim 1, wherein a size of the mesh region is larger than an inter-beam pitch size on the surface of the target object.

9. A multiple charged particle beam writing method comprising:

dividing each stripe region of a plurality of stripe regions obtained by dividing a writing region of a target object by a size of a first direction of a beam array region of multiple charged particle beams on a surface of the target object in the first direction into a plurality of mesh regions in the first direction and in a second direction that is a movement direction of a stage along the each stripe region;

calculating, for each divided mesh region, a representative value of a plurality of doses of a plurality of beams with which an inside of the mesh region is irradiated as a dose representative value;

performing a calculation process of a rising temperature given to a mesh region of interest being one of the plurality of mesh regions by heat due to beam irradiation to each of the plurality of mesh regions in a processing region corresponding to the beam array region, the calculation process including a calculation process being a convolution process using the dose representative value for each of the plurality of mesh regions and a thermal spread function representing thermal spread generated by the plurality of mesh regions;

performing a repetitive process of repeating the calculation process while shifting a position in the second direction on the stripe region and calculating, as an effective temperature of the mesh region of interest, a representative value of a plurality of the rising temperatures obtained by performing the repetitive process a plurality of times until the mesh region of interest reaches, from one end of the processing region in the second direction, the other end;

correcting, using the effective temperature, doses of a plurality of beams with which each mesh region of interest is irradiated; and writing a pattern on the target object using the multiple charged particle beams having respective corrected doses.

10. A non-transitory computer readable recording media storing a program to make a computer execute, the program comprising:

dividing each stripe region of a plurality of stripe regions obtained by dividing a writing region of a target object by a size of a first direction of a beam array region of multiple charged particle beams on a surface of the target object in the first direction into a plurality of mesh regions in the first direction and in a second direction that is a movement direction of a stage along the each stripe region;

calculating, for each divided mesh region, a representative value of a plurality of doses of a plurality of beams with which an inside of the mesh region is irradiated as a dose representative value;

performing a calculation process of a rising temperature given to a mesh region of interest being one of the plurality of mesh regions by heat due to beam irradiation to each of the plurality of mesh regions in a processing region corresponding to the beam array region, the calculation process including a calculation process being a convolution process using the dose representative value for each of the plurality of mesh regions and a thermal spread function representing thermal spread generated by the plurality of mesh regions;

performing a repetitive process of repeating the calculation process while shifting a position in the second direction on the stripe region and calculating, as an effective temperature of the mesh region of interest, a representative value of a plurality of the rising temperatures obtained by performing the repetitive process a plurality of times until the mesh region of interest reaches, from one end of the processing region in the second direction, the other end; and correcting, using the effective temperature, doses of a plurality of beams with which each mesh region of interest is irradiated.

* * * * *